(12) United States Patent
Shinohara

(10) Patent No.: US 12,506,403 B2
(45) Date of Patent: Dec. 23, 2025

(54) ELECTRIC-POWER CONVERSION APPARATUS

(71) Applicant: Mitsubishi Electric Corporation, Tokyo (JP)

(72) Inventor: Ryo Shinohara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 211 days.

(21) Appl. No.: 18/469,678

(22) Filed: Sep. 19, 2023

(65) Prior Publication Data

US 2024/0146182 A1 May 2, 2024

(30) Foreign Application Priority Data

Oct. 27, 2022 (JP) ................................. 2022-172001

(51) Int. Cl.
*H02M 1/32* (2007.01)
*H02M 7/00* (2006.01)
(Continued)

(52) U.S. Cl.
CPC ........... *H02M 1/327* (2021.05); *H02M 7/003* (2013.01); *H02M 7/48* (2013.01);
(Continued)

(58) Field of Classification Search
CPC .......... H02M 1/32; H02M 1/327; H02M 1/36; H02M 7/003; H02M 7/48; H02M 7/4803;
(Continued)

(56) References Cited

U.S. PATENT DOCUMENTS 11,778,779 B2 * 10/2023 Guo .................... H05K 7/20263
700/282
2016/0254212 A1 9/2016 Kusaka
(Continued)

FOREIGN PATENT DOCUMENTS

JP 2001-169401 A 6/2001
JP 201582869 A 4/2015
(Continued)

OTHER PUBLICATIONS

Japanese Office Action issued on Sep. 30, 2025, in Patent Application No. 2022-172001.

*Primary Examiner* — Thienvu V Tran
*Assistant Examiner* — Shahzeb K Ahmad
(74) *Attorney, Agent, or Firm* — Sughrue Mion, PLLC

(57) ABSTRACT

The electric-power conversion apparatus comprises: switching devices each permitting a current to flow therethrough or shutting off that current; a device temperature detector that detects a temperature of one or more of the switching devices; a cooler that cools down the switching devices; a cooling-medium state detector that detects a state of a cooling medium passing through the cooler; and a control unit that controls the switching devices to perform electric-power conversion, and performs overheat prevention control of the switching devices; wherein the control unit determines a temperature threshold value for judging whether the overheat prevention control is necessary or not, on the basis of the state of the cooling medium detected by the cooling-medium state detector, and performs the overheat prevention control by restricting operations of the switching devices, when the temperature detected by the device temperature detector is higher than the temperature threshold value.

13 Claims, 23 Drawing Sheets

(51) Int. Cl.
*H02M 7/48* (2007.01)
*H02M 7/5387* (2007.01)
*H05K 7/20* (2006.01)

(52) U.S. Cl.
CPC ... *H02M 7/53871* (2013.01); *H02M 7/53873* (2013.01); *H05K 7/20927* (2013.01); *H05K 7/20945* (2013.01)

(58) Field of Classification Search
CPC .. H02M 7/483; H02M 7/487; H02M 7/53871; H02M 7/53873; H02P 27/04; H02P 27/06; H02P 27/08; H02P 27/085; H02P 29/60; H02P 29/62; H02P 29/68; H05K 7/2089; H05K 7/20927; H05K 7/20945; H02H 7/08
See application file for complete search history.

(56) References Cited

U.S. PATENT DOCUMENTS

| | | | |
|---|---|---|---|
| 2016/0260650 A1* | 9/2016 | Taguchi | B60L 15/007 |
| 2018/0058952 A1* | 3/2018 | You | H02P 29/024 |
| 2023/0292475 A1* | 9/2023 | Nakasaka | H02M 1/327 |
| 2023/0327658 A1* | 10/2023 | Okuyama | H03K 17/145 |
| | | | 327/109 |
| 2024/0120821 A1* | 4/2024 | Fujita | H02M 3/156 |

FOREIGN PATENT DOCUMENTS

| | | | | |
|---|---|---|---|---|
| JP | 2017103905 A | | 6/2017 | |
| KR | 20200062596 A | * | 6/2020 | ............. H02P 9/006 |

* cited by examiner

ELECTRIC-POWER CONVERSION APPARATUS

TECHNICAL FIELD

The present disclosure relates to an electric-power conversion apparatus.

BACKGROUND

Electric-power conversion apparatuses are used for converting output modes of electric power. As the electric-power conversion apparatuses, there are an AC-DC converter (Alternate Current-Direct Current Converter) for converting AC power to DC power, an inverter for converting DC power to AC power, a DC-DC converter (Direct Current-Direct Current Converter) for making a change between levels of DC-power input and output voltages, and the like. In many cases, these electric-power conversion apparatuses are each configured with semi-conductor switching devices.

The electric-power conversion apparatus controls a current flowing therethrough by using switching operations of the semiconductor switching devices. Further, according to the switching operations, input power is converted to provide output power. According to the semiconductor switching device, power loss occurs due to a current flowing through the semi-conductor switching device. Most of the power loss appears as heat and thus causes the temperature of the semiconductor switching device to rise. A maximum operating temperature Tjmax has been determined for the semiconductor switching device, and if the semiconductor switching device is driven continuously even after exceeding the maximum operating temperature Tjmax, it may be possibly deteriorated in performance or broken, due to overheating. Thus, in some cases, the electric-power conversion apparatus is provided with a cooler that cools down a heating portion in order to prevent overheating of the semiconductor switching device. (Note that the maximum operating temperature Tjmax is not shown in the figures)

There is disclosed a technique in which a temperature detector capable of detecting a temperature of the semiconductor switching device is provided in the electric-power conversion apparatus, and when the detection temperature exceeds a specified threshold value, the output of the electric-power conversion apparatus is reduced in order to prevent overheating of the semiconductor switching device. Since the output is reduced, it is possible to protect the semiconductor switching device by avoiding its temperature from exceeding the maximum operating temperature Tjmax (for example, Patent Document 1).

CITATION LIST

Patent Document

Patent Document 1: Japanese Patent Application Laid-open No. 2001-169401

According to the technique of Patent Document 1, when a temperature of a part of the semiconductor switching devices detected by the temperature detector exceeds the specified threshold value, the output of the electric-power conversion apparatus is restricted without exception. According to this technique, however, it is not possible to deal with a situation where the temperature-rise behavior at a junction portion of the semiconductor switching device varies depending on a state of the cooler for cooling down the semiconductor switching devices. Thus, depending on a state of the cooler, such a case arises where, even though the junction portion of the semiconductor switching device is in a state in which its temperature rise is still allowed, the output is unduly restricted because of the detection temperature exceeding the specified threshold value. In that case, the electric-power conversion apparatus results in overly restricting the ability of the semiconductor switching devices, and thus cannot fully exert its performance.

SUMMARY

This application discloses a technique for solving the problem as described above. Thus, in an electric-power conversion apparatus having a cooler, a detection-temperature threshold value to be used for determining whether to restrict the output of the electric-power conversion apparatus, is changed on the basis of a state of a cooling medium flowing in the cooler. With use of this technique, an object of this application is to provide an efficient electric-power conversion apparatus which suppresses unduly restricting the output of the electric-power conversion apparatus while preventing overheating of its semiconductor switching devices more appropriately.

Solution to Problem

An electric-power conversion apparatus according to this application comprises:

switching devices that each permit a current to flow therethrough or shut off that current;

at least one device temperature detector that detects a temperature of one or more of the switching devices;

a cooler that cools down the switching devices;

a cooling-medium state detector that detects a state of a cooling medium passing through the cooler; and a control unit that controls the switching devices to thereby perform electric-power conversion, and that performs overheat prevention control of the switching devices;

wherein the control unit determines a temperature threshold value to be used for judging whether the overheat prevention control is necessary or not, on a basis of the state of the cooling medium detected by the cooling-medium state detector; and when the temperature detected by said at least one device temperature detector is higher than the temperature threshold value, the control unit performs the overheat prevention control by restricting operations of the switching devices.

Advantageous Effects

According to this disclosure, in an electric-power conversion apparatus having a cooler, a detection-temperature threshold value to be used for determining whether to restrict the output of the electric-power conversion apparatus, is changed on the basis of a state of the cooling medium flowing in the cooler. The electric-power conversion apparatus can be configured to restrict the output thereof when the temperature of its semiconductor switching device(s) detected by the temperature detector is higher than said temperature threshold value. Accordingly, it is possible to provide an efficient electric-power conversion apparatus which suppresses unduly restricting the output of the electric-power conversion apparatus while preventing overheating of the semiconductor switching devices more appropriately.

DESCRIPTION OF EMBODIMENTS

Hereinafter, embodiments of electric-power conversion apparatuses according to this disclosure will be described with reference to the drawings.

1. Embodiment 1

<Configuration of Electric-Power Conversion Apparatus>

Figure 1:
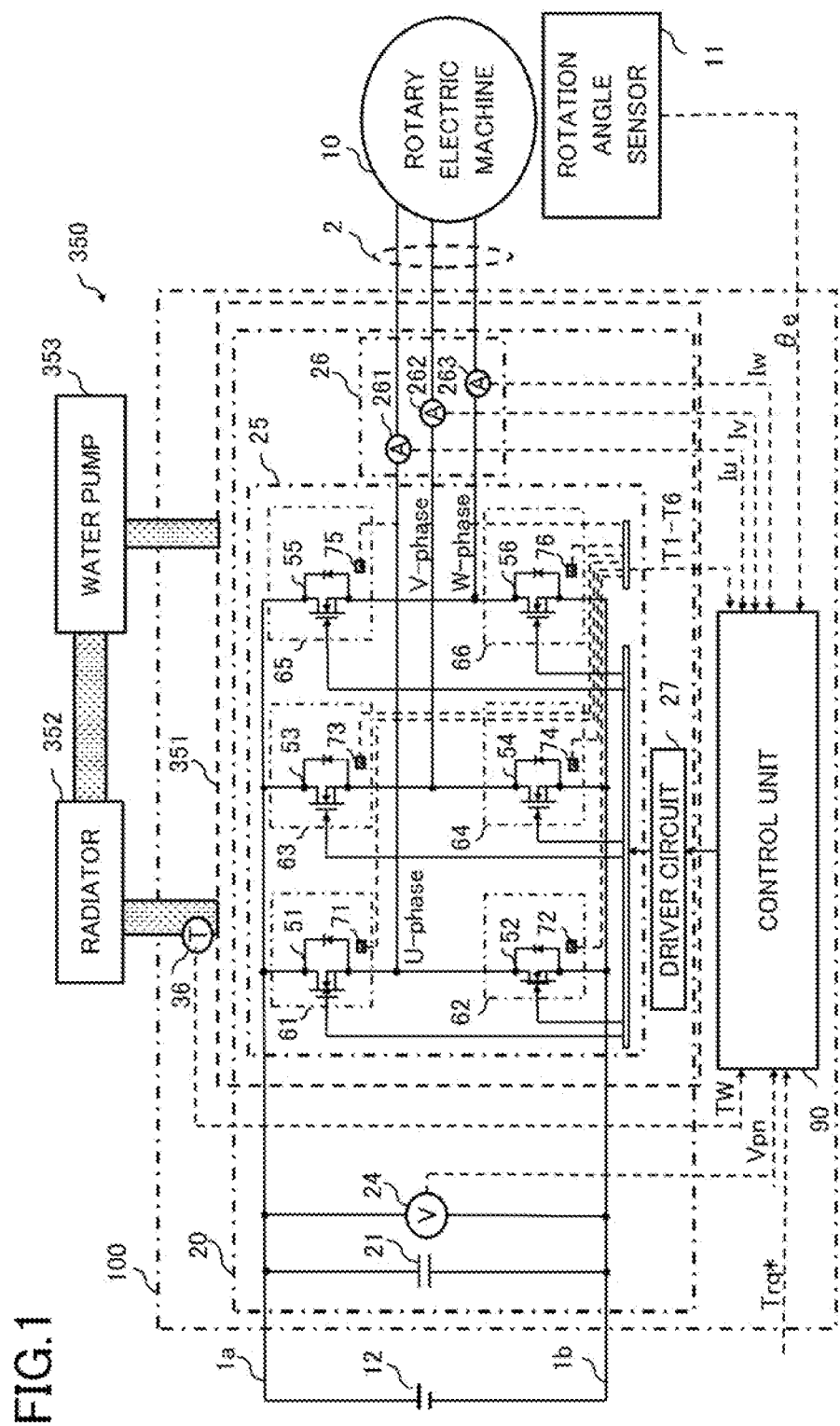
FIG. 1 is a configuration diagram of an electric-power conversion apparatus according to Embodiment 1.

FIG. 1 is a configuration diagram of an electric-power conversion apparatus 100 according to Embodiment 1. The electric-power conversion apparatus 100 may be used in an electric vehicle, such as a battery vehicle, a plug-in hybrid vehicle, or the like. It may be assumed to be an electric-power conversion apparatus for driving a motor powered by electric power from a high voltage battery.

The electric-power conversion apparatus 100 includes: semiconductor switching devices 51 to 56 that convert power by their switching operations; a cooler 351; a control unit 90; and device temperature detectors 71 to 76. The cooler 351 cools down the semiconductor switching devices 51 to 56. The control unit 90 controls the semiconductor switching devices 51 to 56. The device temperature detectors 71 to 76 detect the temperatures of the semiconductor switching devices 51 to 56, respectively.

When one or more of temperature detection values T1 to T6 of the respective device temperature detectors 71 to 76 are higher than a specified temperature threshold value OT, the control unit 90 restricts operations of the semiconductor switching devices 51 to 56 so as to suppress temperature rise of the semiconductor switching devices 51 to 56. Such a control that prevents overheating of the semiconductor switching devices 51 to 56 is generally referred to as overheat protection control.

The cooler 351 is provided with a cooling-medium state detection means that detects a state of a cooling medium flowing into the cooler 351. In FIG. 1, as the cooling-medium state detection means, a water temperature sensor 36 is provided that detects a temperature of the cooling water flowing in the cooler 351. The control unit 90 sets the temperature threshold value on the basis of a temperature TW of the cooling medium detected by the water temperature sensor 36.

What shown in FIG. 1 includes: a DC power source 12, such as a battery or the like, that supplies DC power to the electric-power conversion apparatus 100 and is charged by a regenerative power; and a rotary electric machine 10 as a control target. The control target is not limited to the rotary electric machine 10 and may be other than the rotary electric machine 10.

In FIG. 1, the electric-power conversion apparatus 100 is connected to the DC power source 12 by way of a positive-side DC bus line 1a and a negative-side DC bus line 1b, and gives regenerative power to, or receives driving power from, the DC power source 12. Further, the electric-power conversion apparatus 100 is connected to the rotary electric machine 10 by way of AC bus lines 2, and gives driving power to, or receives regenerative power from, the rotary electric machine 10.

The rotary electric machine 10 is provided with a rotation angle sensor 11 that detects a rotation angle θm of the rotary electric machine 10. The rotary electric machine 10 rotationally drives a load and can regenerate electric energy from rotation energy of the load. For example, a permanent-magnet three-phase AC synchronous motor or a three-phase brushless motor may be used as that rotary electric machine (Note that the rotation angle θm is not shown in the figures).

The electric-power conversion apparatus 100 includes an electric-power conversion unit 20, and to which the cooler 351 that cools down the heating portion of the electric-power conversion unit 20 is attached. The electric-power conversion unit 20 has the positive-side DC bus line 1a and the negative-side DC bus line 1b that are connected to the DC power source 12, and includes, in a state connected therebetween, a capacitor 21 and a voltage detection unit 24 that detects a DC bus-line voltage of the electric-power conversion unit 20. The electric-power conversion unit 20 is configured with the multiple semiconductor switching devices 51 to 56, and includes an inverter circuit 25 that performs electric-power conversion from DC to AC, and a current detection unit 26 that detects currents of the rotary electric machine 10 flowing in the AC bus lines 2. Further, the electric-power conversion unit 20 includes a driver circuit 27 for switching between on and off states of each of the semiconductor switching devices 51 to 56. The electric-power conversion unit 20 is controlled by the control unit 90.

The capacitor 21 has a function of reducing a ripple of the DC bus-line voltage, a function of reducing a power-source impedance in the electric-power conversion unit 20 to thereby improve AC-current drive capability of the electric-power conversion unit 20, a function of absorbing a surge voltage, and the like. Further, using a voltage dividing resistance or the like, the voltage detection unit 24 divides the DC bus-line voltage to generate a voltage that is readable by the control unit 90, to thereby output information of the DC bus-line voltage to the control unit 90.

The inverter circuit 25 is a generally well-known inverter in which six semiconductor switching devices 51 to 56 are connected into a full-bridge structure. Namely, as shown in FIG. 1, the semiconductor switching devices 51, 52 are an upper-side semiconductor switching device and a lower-side semiconductor switching device, respectively, and the same applies to the semiconductor switching devices 53, 54 and to the semiconductor switching devices 55, 56. The upper-side semiconductor switching device and the lower-side semiconductor switching device are connected in series to each other, and they are connected in parallel with respect to the DC power source 12.

Note that a midpoint between the semiconductor switching devices 51, 52 is connected to a U-phase input of the rotary electric machine 10. A midpoint between the semiconductor switching devices 53, 54 is connected to a V-phase input of the rotary electric machine 10. Further, a midpoint between the semiconductor switching devices 55, 56 is connected to a W-phase input of the rotary electric machine 10. The semiconductor switching devices 51 to 56 are embedded in semiconductor modules 61 to 66, respectively.

<Semiconductor Switching Device>

As the semiconductor switching device, a diode that allows a current to flow only in one direction, a thyristor that is suited for handling a large current, or a power transistor as a power semiconductor switching device that is operable at a high switching frequency, is used. The power transistors are used in a wide variety of fields including automobiles, refrigerators, air conditioners, etc. There are IGBTs (Insulated Gate Bipolar Transistors) and MOS-FETs (Metal-Oxide-Semiconductor Field-Effect-Transistors) in the power transistors, so that different types of these power transistors are used in accordance with various usages.

Recently, as a material of the semiconductor switching device, attention is focused on silicon carbide (SiC) and gallium nitride (GaN). As compared with a conventional semiconductor switching device using silicon (Si), the semiconductor switching device formed of such a material has a lower on-state resistance value and thus can reduce the power loss. Further, it has a high electron-saturation speed and thus can reduce the power loss by speeding up switching between the on and off states. Furthermore, the semiconductor switching device using silicon carbide or gallium nitride is operable under a higher temperature environment as compared with the semi-conductor switching device using silicon.

For example, the semiconductor switching devices 51 to 56 are each a MOS-FET incorporating a diode between its source and drain, as shown in FIG. 1. Note that the types and the number of the semiconductor switching devices are not limited thereto. The semiconductor switching device may be another semi-conductor switching device, for example, an IGBT, a MOSFET using SiC, or the like.

In addition, in the inverter circuit 25, in order to detect the temperatures of the semiconductor switching devices 51 to 56, the device temperature detectors 71 to 76 are placed inside or near the semiconductor modules 61 to 66, respectively. The temperature detection values T1 to T6 detected by the device temperature detectors 71 to 76 are inputted to the control unit 90. The device temperature detectors 71 to 76 are device temperature detectors according to Embodiment 1.

Note that the device temperature detectors 71 to 76 for detecting the temperatures of the semiconductor switching devices 51 to 56 may be placed inside the semiconductor modules 61 to 66. The device temperature detectors 71 to 76 may be placed near the semiconductor modules 61 to 66, on a board on which the semiconductor modules 61 to 66 are placed. The device temperature detectors 71 to 76 are assumed to be thermistors. However, the device temperature detector is not limited to a thermistor, and such a configuration may be employed in which temperature detection diodes or the like are located on the respective semiconductor substrates of the semiconductor switching devices 51 to 56, to thereby detect the temperatures thereof.

The current detection unit 26 is configured with a U-phase current detection unit 261, a V-phase current detection unit 262 and a W-phase current detection unit 263. The U-phase current detection unit 261, the V-phase current detection unit 262 and the W-phase current detection unit 263 are each configured with a shunt resistor, for example. The U-phase current detection unit 261 outputs a U-phase current detection value corresponding to a U-phase current Iu, to the control unit 90. The V-phase current detection unit 262 outputs a V-phase current detection value corresponding to a V-phase current Iv, to the control unit 90. The W-phase current detection unit 263 outputs a W-phase current detection value corresponding to a W-phase current Iw, to the control unit 90. Note that, in the following description, there are cases where the U-phase current detection value, the V-phase current detection value and the W-phase current detection value are referred to collectively as a current detection value. Further, the current detection unit 26 may be configured as current sensors using hall devices.

The driver circuit 27 is controlled on the basis of a PWM signal inputted thereto from the control unit 90. The driver circuit 27 has a function of switching between on and off states of each of the semiconductor switching devices 51 to 56.

The rotation angle sensor 11 serves to detect the rotation angle θm of the rotor of the rotary electric machine 10 by using a resolver, an encoder or the like. The rotor rotation angle θm detected by the rotation angle sensor 11 is outputted to the control unit 90. The rotor rotation angle θm is converted into an electric angle θe on the basis of the number of pole pairs of the rotary electric machine 10.

The cooler 351 in a cooling system 350 cools down the semiconductor switching devices 51 to 56. The cooling system 350 is, for example, a water-cooling type cooling system. Specifically, the cooling system 350 has such a configuration in which the cooler 351 of a water-cooling type, a radiator 352, a water pump 353, etc. are connected with each other through a cooling water pipeline, such as a hose. A cooling medium such as water, an oil or an LLC (Long Life Coolant) is caused to flow into the cooler 351 from the water pump 353 through the radiator 352. With respect to the flow direction, the cooling medium may instead flow into the cooler 351 from the radiator 352 through the water pump 353.

The water temperature sensor 36 is a cooling-medium state detection means according to Embodiment 1, which detects the temperature TW of the cooling medium flowing in the cooling water pipeline and outputs it to the control unit 90. For example, the water temperature sensor 36 is located in the cooler beneath the semiconductor modules. Note that the water temperature sensor 36 is not structurally limited to being located in the cooler, and may be located in the cooling water pipeline.

<Hardware Configuration of Control Unit>

Figure 2:
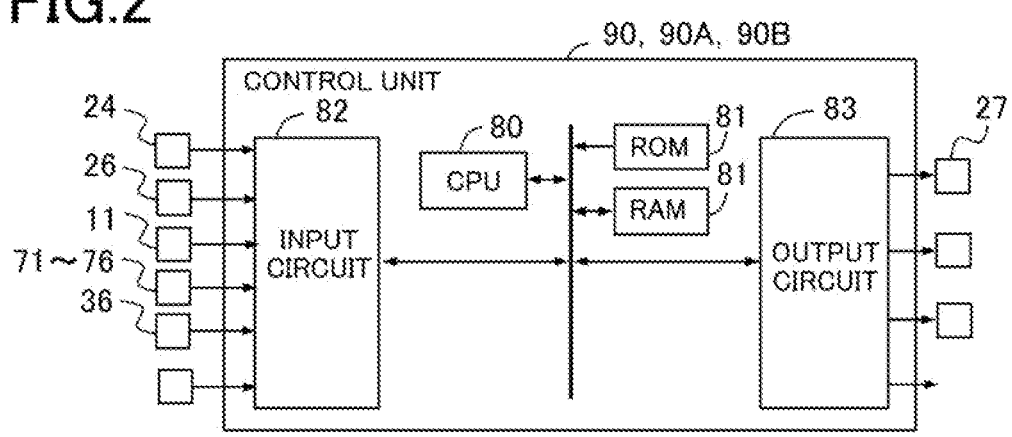
FIG. 2 is a hardware configuration diagram of a control unit in the electric-power conversion apparatus according to Embodiment 1.

FIG. 2 is a hardware configuration diagram of the control unit 90 in the electric-power conversion apparatus 100 according to Embodiment 1. Although FIG. 2 may be applied also to control units 90A, 90B to be described later, description is herein made about the control unit 90 as a representative. In this Embodiment, the control unit 90 is a control unit for controlling the electric-power conversion apparatus 100. The respective functions of the control unit 90 are implemented by a processing circuit included in the control unit 90. Specifically, the control unit 90 includes as the processing circuit: an arithmetic processing device 80 (computer) such as a CPU (Central Processing Unit) or the like; storage devices 81 that perform data transactions with the arithmetic processing device 80; an input circuit 82 that inputs external signals to the arithmetic processing device 80; an output circuit 83 that externally outputs signals from the arithmetic processing device 80; and the like.

As the arithmetic processing device 80, there may be included an ASIC (Application Specific Integrated Circuit), an IC (Integrated Circuit), a DSP (Digital Signal Processor), an FPGA (Field Programmable Gate Array), any one of a variety of logic circuits, any one of a variety of signal processing circuits, or the like. Further, multiple arithmetic processing devices 80 of the same type or different types may be included so that the respective parts of processing are executed in a shared manner. As the storage devices 81, there are included a RAM (Random Access Memory) that is configured to allow reading and writing of data by the arithmetic processing device 80, a ROM (Read Only Memory) that is configured to allow reading of data by the arithmetic processing device 80, and the like. The input circuit 82 is provided with interface circuits such as A-D conversion units, signal receiving circuits and the like to which a variety of sensors and switches including the rotation angle sensor 11, the voltage detection unit 24, the current detection unit 26, the device temperature detectors 71 to 76 and the water temperature sensor 36 are connected, and which serve to input the output signals of the sensors and switches to the arithmetic processing device 80. The output circuit 83 is provided with interface circuits such as driving circuits, communication circuits and the like to which electric loads such as the switching devices, actuators and the like including the driver circuit 27 are connected, and which output the output signals from the arithmetic processing device 80, after converting them, to these electric loads.

The respective functions that the control unit 90 includes, are implemented in such a manner that the arithmetic processing device 80 executes software (programs) stored in the storage device 81 such as the ROM or the like, to thereby cooperate with the other hardware in the control unit 90, such as the other storage device 81, the input circuit 82, the output circuit 83, etc. Note that the set data of threshold values, determinative values, etc. to be used by the control unit 90 is stored, as a part of the software (programs), in the storage device 81 such as the ROM or the like.

Each of the functions installed in the control unit 90 may be established by a software module. However, each of the functions installed in the control unit 90 may be established by a combination of software and hardware.

<Function Blocks of Control Unit>

Figure 3:
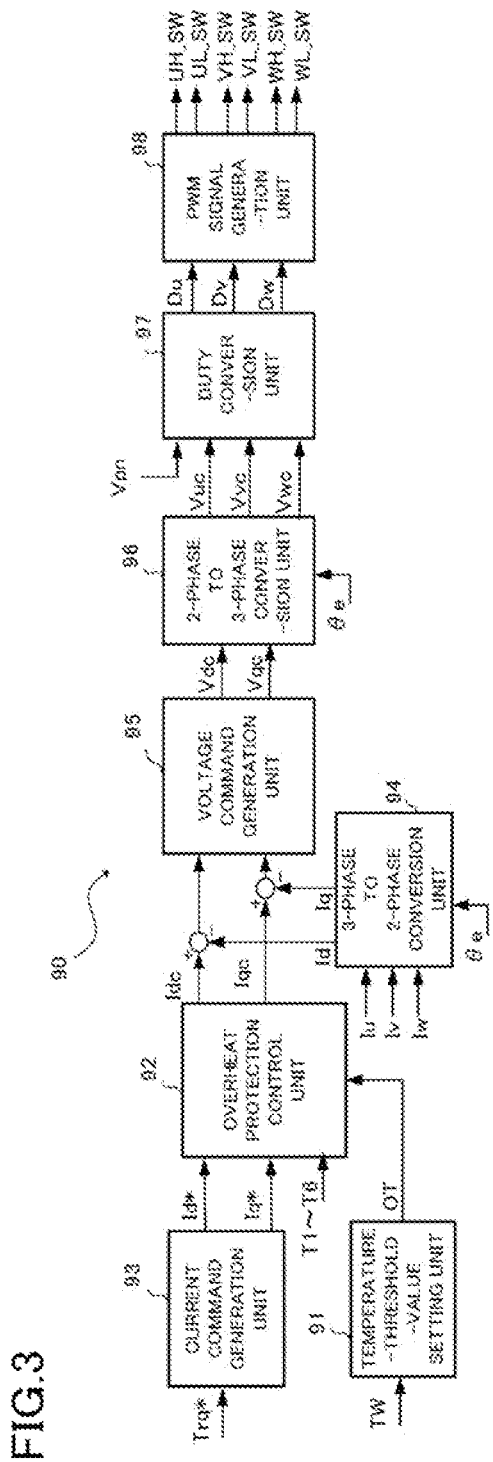
FIG. 3 is a function block diagram of the control unit in the electric-power conversion apparatus according to Embodiment 1.

FIG. 3 is a function block diagram of the control unit 90 in the electric-power conversion apparatus 100 according to Embodiment 1. In FIG. 3, the control unit 90 has: a temperature-threshold-value setting unit 91; an overheat protection control unit 92; a current command generation unit 93; a three-phase to two-phase conversion unit 94; a voltage command generation unit 95; a two-phase to three-phase conversion unit 96; a duty conversion unit 97; and a PWM signal generation unit 98.

To the current command generation unit 93 is inputted a torque command value Trq* from an upper-level system (not illustrated). Note that examples of the control command for controlling the rotary electric machine 10 include a torque command, a current command, a voltage command and the like. In Embodiment 1, an exemplary case is shown where the torque command value Trq* is employed as the control command. The current command generation unit 93 generates a d-axis current command value Id* and a q-axis current command value Iq* on the basis of the torque command value Trq*.

Here, the d-axis represents a magnetic pole position of the rotary electric machine 10, namely, a direction of the magnetic flux, and the q-axis represents a direction electrically orthogonal to the d-axis, so that these axes constitute a d-q-axis coordinate system. The d-q-axis coordinate system is a rotating coordinate system, so that when the rotor of the rotary electric machine 10 having a magnet is rotated, the d-q-axis coordinate system is also rotated.

The temperature-threshold-value setting unit 91 has, as a feature of this application, a function of calculating a temperature threshold value used for executing overheat protection control, on the basis of a state of the cooling medium.

From the water temperature sensor 36, the temperature TW of the cooling medium is inputted to the temperature-threshold-value setting unit 91, and on the basis of the temperature TW of the cooling medium, the temperature-threshold-value setting unit calculates the temperature threshold value OT used for executing overheat protection control. Then, it outputs the temperature threshold value OT to the overheat protection control unit 92. A more detailed configuration of the temperature-threshold-value setting unit 91 will be described later.

The overheat protection control unit 92 has, as a feature of this application, a function of controlling operations of the switching devices so as to restrict the currents flowing therethrough, on the basis of the temperature threshold value OT calculated on the basis of the temperature TW of the cooling medium. The d-axis current command value Id*, the q-axis current command value Iq* and the temperature threshold value OT are inputted to the overheat protection control unit 92, and further the temperature detection values T1 to T6 are inputted thereto from the device temperature detectors 71 to 76. Then, if the maximum value among the temperature detection values T1 to T6 is larger than the temperature threshold value OT, the overheat protection control unit generates a d-axis current command value Idc and a q-axis current command value Iqc by restricting the d-axis current command value Id* and the q-axis current command value Iq* to specified current command values. If the maximum value among the temperature detection values T1 to T6 is smaller than the temperature threshold value OT, the overheat protection control unit generates a d-axis current command value Idc and a q-axis current command value by using as these current command values, the d-axis current command value Id* and the q-axis current command value Iq* without change.

Using the current detection values of the current detection unit 26 and an angle detection value corresponding to the electric angle θe detected by the rotation angle sensor 11, the three-phase to two-phase conversion unit 94 calculates a d-axis current detection value Id and a q-axis current detection value Iq. Here, the current detection values of the current detection unit 26 are comprised of: the U-phase current detection value corresponding to the U-phase current Iu detected by the U-phase current detection unit 261; the V-phase current detection value corresponding to the V-phase current Iv detected by the V-phase current detection unit 262; and the W-phase current detection value corresponding to the W-phase current Iw detected by the W-phase current detection unit 263.

Using the d-axis current command value Idc and the q-axis current command value Iqc as well as the d-axis current detection value Id and the q-axis current detection value Iq, the voltage command generation unit 95 performs current feedback calculation to thereby calculate a d-axis voltage command Vdc and a q-axis voltage command Vqc. Specifically, for example, the voltage command generation unit 95 is configured to calculate the d-axis voltage command Vdc and the q-axis voltage command Vqc so that a current deviation ΔId that is a deviation between the d-axis current command value Idc and the d-axis current detection value Id, and a current deviation ΔIq that is a deviation between the q-axis current command value Iqc and the q-axis current detection value Iq, are each converged to "0". ("ΔId" and "ΔIq" are not shown in the figures)

Using the d-axis voltage command Vdc and the q-axis voltage command Vqc acquired from the voltage command generation unit 95 and the electric angle θe acquired from the rotation angle sensor 11, the two-phase to three-phase conversion unit 96 calculates three-phase voltage commands Vuc, Vvc, Vwc. Note that the three-phase voltage command Vuc, Vvc, Vwc is preferred to be set lower than the DC power-source voltage inputted to the voltage conversion unit 20, that is, an input voltage Vpn to be detected by the voltage detection unit 24.

Using the three-phase voltage commands Vuc, Vvc, Vwc acquired from the two-phase to three-phase conversion unit 96, and the input voltage Vpn, the duty conversion unit 97 generates duty commands Du, Dv, Dw for the respective three phases. The duty conversion unit 97 generates and outputs the duty commands Du, Dv, Dw corresponding to an optimal-correction control command.

The PWM signal generation unit 98 generates PWM signals. Using the duty commands Du, Dv, Dw for the respective phases acquired from the duty conversion unit 97, the PWM signal generation unit 98 generates the PWM signals for performing on-off switching control of each of the semiconductor switching devices 51 to 56.

Specifically, the PWM signal generation unit 98 generates the PWM signals by comparing each of the duty commands Du, Dv, Dw for the respective phases with the carrier wave. The PWM signal generation unit 98 is configured to generate the PWM signals by employing, for example, a triangular wave comparison method that uses, as the carrier wave, a triangular wave having an isosceles triangle shape in which the rising rate and the falling rate are matched with each other, a sawtooth wave comparison method, or the like.

It is noted that, in FIG. 3, as PWM signals generated by the PWM signal generation unit 98, a PWM signal UH_SW to be given to a U-phase upper-arm semiconductor switching device 51, a PWM signal VH_SW to be given to a V-phase upper-arm semiconductor switching device 53 and a PWM signal WH_SW to be given to a W-phase upper-arm semiconductor switching device 55, are shown. Further, as PWM signals generated likewise by the PWM signal generation unit 98, a PWM signal UL_SW to be given to a U-phase lower-arm semiconductor switching device 52, a PWM signal VL_SW to be given to a V-phase lower-arm semiconductor switching device 54 and a PWM signal WL_SW to be given to a W-phase lower-arm semiconductor switching device 56, are shown.

The PWM signals generated by the PWM signal generation unit 98 are inputted to the driver circuit 27 of the electric-power conversion unit 20 from the control unit 90. By the driver circuit 27, the semiconductor switching devices 51 to 56 are operated to be turned on or off on the basis of the PWM signals, so that DC power is converted into AC power which is then supplied to the rotary electric machine 10 and further regenerative power generated in a generative state of the rotary electric machine 10 is charged in the DC power source 12.

Here, the electric-power conversion apparatus 100 according to Embodiment 1 is characterized in that the temperature-threshold-value setting unit 91 and the overheat protection control unit 92 are provided in the control unit 90. Note that the temperature threshold value OT is set by the temperature-threshold-value setting unit 91 on the basis of the temperature TW of the cooling medium, and the d-axis current command value and the q-axis current command value are restricted to specified current command values by the overheat protection control unit 92 on the basis of the temperature detection values T1 to T6 and the temperature threshold value OT. In addition, the electric-power conversion apparatus according to Embodiment 1 is characterized in that the temperature-threshold-value setting unit 91 sets the temperature threshold value OT so that it becomes higher as the temperature TW of the cooling medium increases.

<Cases where Temperature Threshold Value OT is Fixed Value>

Here, in order to explain an effect created by the method of setting the temperature threshold value OT on the basis of the temperature TW of the cooling medium, that is a feature of the electric-power conversion apparatus 100 according to Embodiment 1, description will be made about cases where the temperature threshold value OT is a fixed value. When the temperature threshold value OT is a fixed value, depending on a state of the cooling medium, a case may arise where, even though the semiconductor switching devices 51 to 56 are in a state in which temperature rise of them is still allowed, the output is unduly restricted. This case will be described using FIGS. 4 and 5.

Figure 4:
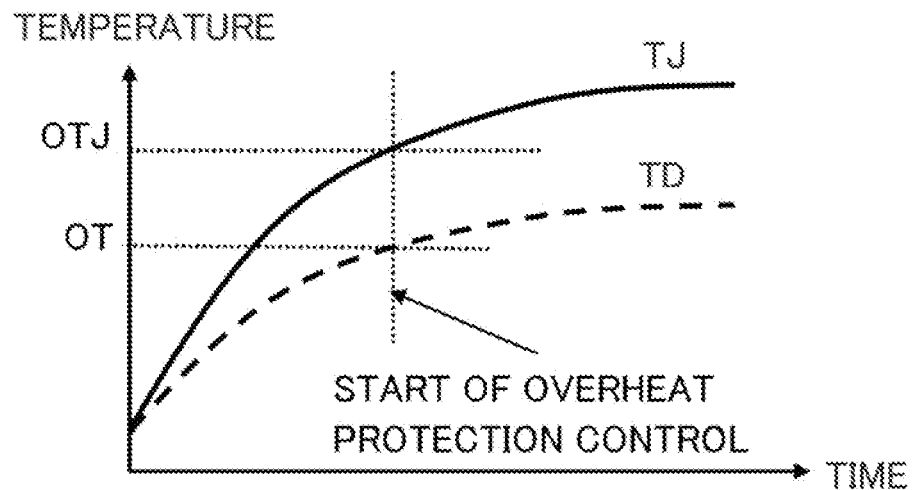
FIG. 4 is a first graph illustrating a relationship between a fixed temperature threshold value and a device temperature, with respect to the electric-power conversion apparatus according to Embodiment 1.
Figure 5:
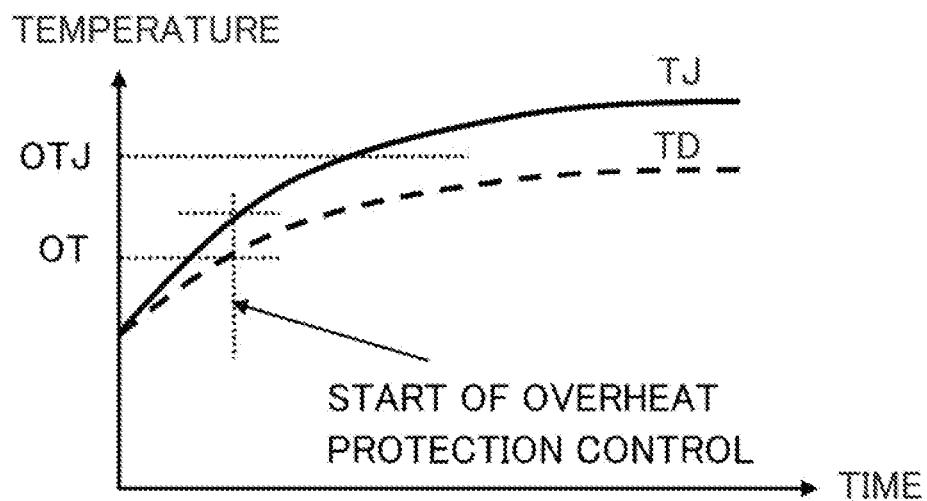
FIG. 5 is a second graph illustrating a relationship between the fixed temperature threshold value and a device temperature, with respect to the electric-power conversion apparatus according to Embodiment 1.

FIG. 4 is a first graph illustrating a relationship between a fixed temperature threshold value OT and a device junction portion temperature TJ, with respect to the electric-power conversion apparatus 100 according to Embodiment 1. FIG. 5 is a second graph illustrating a relationship between the fixed temperature threshold value and a device junction portion temperature TJ. Note that the cooling medium is a liquid such as water, an oil, an LLC or the like.

FIG. 4 is a graph schematically showing a timing chart of the junction portion temperature TJ about the semiconductor switching devices 51 to 56 and a detection temperature TD according to the device temperature detectors 71 to 76, in a case where the electric-power conversion apparatus 100 is driven with a given load from the stopped state when the temperature TW of the cooling medium is low. Here, the junction portion temperature TJ is a temperature of a junction portion of the semiconductor switching device to be measured or estimated by a special inspection device, an additional temperature sensor or the like, and it is difficult to measure this temperature using a commercially available product. In the following, the temperature detection values T1 to T6 according to the device temperature detectors 71 to 76 will be described while being referred to collectively as the detection temperature TD.

FIG. 5 is a graph schematically showing a timing chart of the actual junction portion temperature TJ about the semiconductor switching devices 51 to 56 and the detection temperature TD according to the device temperature detectors 71 to 76, in a case where the electric-power conversion apparatus is driven with the given load from the stopped state when the temperature TW of the cooling medium is high. Note that, as the timing chart of the device junction portion temperature TJ and the detection temperature TD, in each of FIGS. 4 and 5, such a temperature timing chart is shown that is obtained when no overheat protection control is executed, in order to make the difference in temperature rise due to level of the temperature TW of the cooling medium, easy to understand. In each of FIGS. 4 and 5, at the starting point of the graph, the detection temperature TD and the junction portion temperature TJ are both equal to the temperature TW of the cooling medium.

With respect to the electric-power conversion apparatus 100 provided with the cooler 351 that cools down the heating devices as the semiconductor switching devices 51 to 56, when the temperature TW of the cooling medium is low, the difference between the temperature of the cooling medium and an operating limit temperature OTJ of the semiconductor switching device is large. Said differently, with reference to the temperature of the cooling medium, an allowable temperature-rise amount of the semiconductor switching device increases. Thus, when the temperature of the cooling medium is low, since the cooling capability (cooling capacity) can be reduced as compared with the case where the temperature of the cooling medium is high, the flow rate of the cooling medium is generally decreased for the purpose of power suppression of a pump accessory such as the water pump 353 or the like for circulating the cooling medium. In addition, since the cooling medium as a liquid has a property that its viscosity becomes higher and thus it becomes less likely to flow as the temperature decreases, a decrease in flow rate of the cooling medium occurs in some cases.

Under such conditions, the flow rate of the cooling medium is lower than the case where the temperature of the cooling medium is high, and thus the cooling capability is reduced. Accordingly, as shown in FIG. 4, as compared with the case where the temperature of the cooling medium is high, even when the semiconductor switching devices 51 to 56 are driven with the same power loss, the temperature rise of the semiconductor switching device is started at a lower temperature and the inclination of the temperature rise is steeper.

As described previously, as the device temperature detectors 71 to 76 that detect the temperatures of the semiconductor switching devices 51 to 56, temperature sensors such as thermistors, temperature detection diodes or the like are located inside the semiconductor modules or outside but near the semiconductor modules. However, it is difficult to directly measure the junction portion temperature (junction temperature) TJ that is highest in the semiconductor switching device, and thus the detection temperature TD has a gap from the junction portion temperature TJ of the semiconductor switching device.

Further, there is also a time delay (response delay) until the detection temperature TD according to the device temperature detectors 71 to 76 gets equal to the temperature of the measuring object. Thus, as shown in FIG. 4, in the case where the temperature rise of the semiconductor switching devices 51 to 56 is steep, the gap between the true device junction portion temperature TJ about the semiconductor switching devices 51 to 56 and the detection temperature TD according to the device temperature detectors 71 to 76 is larger as compared with the case where the temperature rise is moderate. Accordingly, when the temperature TW of the cooling medium is low, as shown in FIG. 4, it is necessary to control the detection temperature TD according to the device temperature detectors 71 to 76 at the time the junction portion temperature TJ about the semiconductor switching devices 51 to 56 reaches the operating limit temperature OTJ, to have a value that is sufficiently lower as compared with the case where the temperature TW is high.

Namely, according to a comparative example in which the output of the electric-power conversion apparatus is reduced when the detection temperature TD exceeds the temperature threshold value OT as a fixed value to thereby prevent overheating of the semiconductor switching devices, in order to cover the case shown in FIG. 4 where the temperature TW of the cooling medium is low (the cooling capability is low), it is necessary to set the temperature threshold value OT to a value sufficiently lower than the detection temperature TD according to the device temperature detectors 71 to 76 at the time the junction portion temperature TJ about the semiconductor switching devices reaches the operating limit temperature OTJ. In this case, if the temperature TW of the cooling medium is high (the cooling capability is high), as shown in FIG. 5, the detection temperature TD according to the device temperature detectors 71 to 76 will exceed the fixed temperature threshold value OT even though the junction portion temperature TJ about the semiconductor switching devices 51 to 56 does not yet reach the operating limit temperature OTJ and thus temperature rise of them is still allowed. This results in an operation by which overheat protection is excessively executed.

<Cases where Temperature Threshold Value OT is Set as Variable Value>

For that reason, the electric-power conversion apparatus 100 according to Embodiment 1 is configured to set a temperature threshold value OT at the temperature-threshold-value setting unit 91, on the basis of the temperature TW of the cooling medium. Further, the temperature threshold value OT is set so that it becomes higher as the temperature TW of the cooling medium increases.

Figure 6:
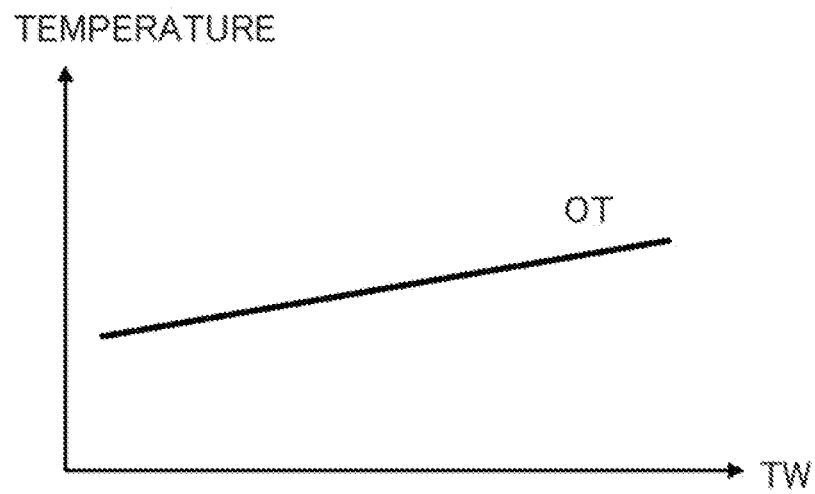
FIG. 6 is a graph illustrating a relationship between a temperature of a cooling medium and a variably-set temperature threshold value, with respect to the electric-power conversion apparatus according to Embodiment 1.

FIG. 6 is a graph illustrating a relationship between a temperature TW of the cooling medium and a variably-set temperature threshold value OT, with respect to the electric-power conversion apparatus 100 according to Embodiment 1. In the following, operations of the temperature-threshold-value setting unit 91 and the overheat protection control unit 92, that are features of the electric-power conversion apparatus 100 according to Embodiment 1, will be described.

The temperature-threshold-value setting unit 91 uses, as an input, the temperature TW of the cooling medium from the water temperature sensor 36, to output the temperature threshold value OT used for executing overheat protection control. The temperature-threshold-value setting unit 91 already includes a threshold-value setting map of temperature threshold values OT relative to temperatures TW of the cooling medium. In order to prevent thermal breakage of the semiconductor switching device, it is required that the temperature threshold value OT relative to the temperature TW of the cooling medium be set so that the junction portion temperature TJ of the semiconductor switching device does not exceed the operating limit temperature OTJ even under severest driving conditions.

The temperature threshold value OT is determined relative to the temperature TW of the cooling medium. For every state of the temperature TW of the cooling medium, the temperature threshold value OT is set to a temperature that is lower by a predetermined margin than the detection temperature TD of the device temperature detectors 71 to 76 that is given at the time the junction portion temperature TJ about the semi-conductor switching devices 51 to 56 reaches the operating limit temperature OTJ when the electric-power conversion apparatus 100 is driven under driving conditions that make the power loss at the semiconductor switching devices 51 to 56 largest.

As already described using FIGS. 4 and 5, in the case where the temperature of the cooling medium is low, as compared with the case where it is high, the detection temperature TD of the device temperature detectors at the time the junction portion temperature TJ about the semiconductor switching devices 51 to 56 reaches the operating limit temperature OTJ, has a lower value. Accordingly, as shown in FIG. 6, the threshold-value setting map of temperature threshold values OT relative to temperatures TW of the cooling medium, is set with a tendency that the temperature threshold value OT becomes higher as the temperature TW of the cooling medium increases.

The overheat protection control unit 92 has a function of controlling operations of the semiconductor switching devices 51 to 56 so as to restrict the currents therethrough, on the basis of the temperature threshold value OT calculated on the basis of the temperature TW of the cooling medium. To the overheat protection control unit 92, the d-axis current command value Id* and the q-axis current command value Iq* are inputted from the current command generation unit 93, the temperature threshold value OT is inputted from the temperature-threshold-value setting unit 91, and the temperature detection values T1 to T6 are inputted from the device temperature detectors 71 to 76.

In the overheat protection control unit 92, a maximum temperature Tmax in the temperature detection values T1 to T6 is compared with the temperature threshold value OT, and if the maximum temperature Tmax is higher than the temperature threshold value OT, command values resulting from multiplying the d-axis current command value Id* and the q-axis current command value Iq* by a ratio (overheat protection gain G) smaller than 1 are generated as the d-axis current command value Idc and the q-axis current command value Iqc, and outputted to the voltage command generation unit 95. The overheat protection gain G is set so that its value becomes smaller as the maximum temperature Tmax increases. Note that the overheat protection gain G is not limited to being set in this manner, and may be set as any given value smaller than 1. (Note that Tmax is not shown in the figures)

If the maximum temperature Tmax in the temperature detection values T1 to T6 is smaller than the temperature threshold value OT, the d-axis current command value Idc and the q-axis current command value Iqc are generated using as these current commands, the d-axis current command value Id* and the q-axis current command value Iq* without change. Then, these command values are outputted to the voltage command generation unit 95. Note that, when the maximum temperature Tmax is compared with the temperature threshold value OT, a specific hysteresis may be set to thereby avoid oscillation due to switching of overheat protection control.

Further, as a temperature threshold value for canceling the overheat protection control, the overheat protection control unit 92 has set a restriction-cancellation temperature threshold value Trst that is a temperature lower than the temperature threshold value OT, so that, when the maximum temperature Tmax is higher than the temperature threshold value OT, the overheat protection control unit continues the aforementioned current-command-value restriction processing until the maximum temperature Tmax reaches a temperature lower than the restriction-cancellation temperature threshold value Trst. (Note that the restriction-cancellation temperature threshold value Trst is not shown in the figures)

Accordingly, when there is a risk that the device junction portion temperature TJ about the semiconductor switching devices 51 to 56 will exceed the operating limit temperature OTJ, operations of the semiconductor switching devices 51 to 56 are restricted so that the currents flowing therethrough are decreased. Thus, the power loss of the semiconductor switching devices 51 to 56 is reduced, so that the temperature rise of the semiconductor switching devices 51 to 56 is suppressed. This makes it possible to prevent the junction portion temperature TJ about the semiconductor switching devices 51 to 56 from exceeding the operating limit temperature OTJ to cause thermal breakage.

Here, it is described that, if the maximum temperature Tmax in the temperature detection values T1 to T6 is higher than the temperature threshold value OT, the overheat protection control unit 92 generates the command values resulting from multiplying the d-axis current command value Id* and the q-axis current command value Iq* by a ratio (overheat protection gain G) smaller than 1, as the d-axis current command value Idc and the q-axis current command value Iqc; however, how to restrict the current command values is not limited to this manner. For example, the d-axis current command value Idc and the q-axis current command value Iqc may be generated by restricting the d-axis current command value Id* and the q-axis current command value Iq* to any given current command values.

<Comparison in Effect>

Here, using FIG. 7 to FIG. 10, description will be made on what effect is achieved unlike the comparative example, when the above control is applied. Namely, the reason why the electric-power conversion apparatus 100 can suppress unduly restricting the output of the electric-power conversion apparatus while surely preventing thermal breakage of the semiconductor switching devices 51 to 56, will be described.

Figure 7:
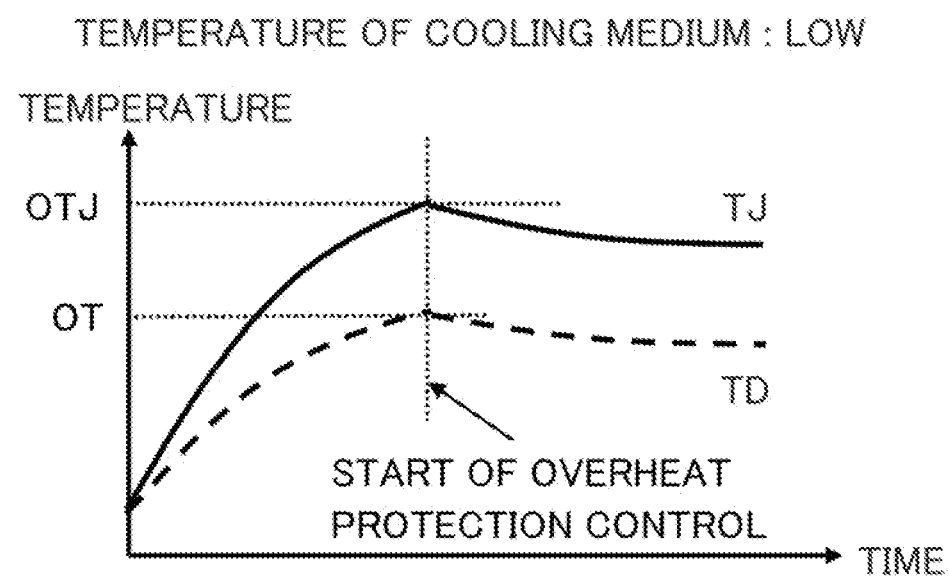
FIG. 7 is a first timing chart showing temperature transitions under prevention of overheating based on the fixed temperature threshold value, with respect to the electric-power conversion apparatus according to Embodiment 1.
Figure 8:
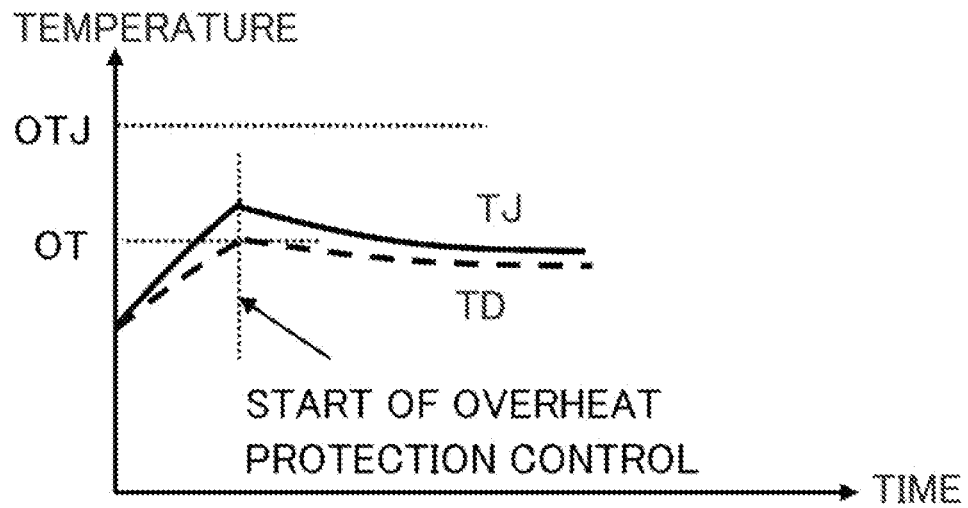
FIG. 8 is a second timing chart showing temperature transitions under prevention of overheating based on the fixed temperature threshold value, with respect to the electric-power conversion apparatus according to Embodiment 1.

FIG. 7 is a first timing chart showing temperature transitions under prevention of overheating based on a fixed temperature threshold value OT, with respect to the electric-power conversion apparatus 100 according to Embodiment 1. FIG. 8 is a second timing chart showing temperature transitions under prevention of overheating based on the fixed temperature threshold value.

FIGS. 7 and 8 are timing charts of the junction portion temperature TJ about the semiconductor switching devices 51 to 56 and the detection temperature TD according to the device temperature detectors 71 to 76. FIG. 7 is the timing chart in a case where the electric-power conversion apparatus 100 is driven with a given load from the stopped state when the temperature TW of the cooling medium is low. FIG. 8 is the timing chart in a case where the electric-power conversion apparatus 100 is driven with the given load from the stopped state when the temperature TW of the cooling medium is high.

Figure 9:
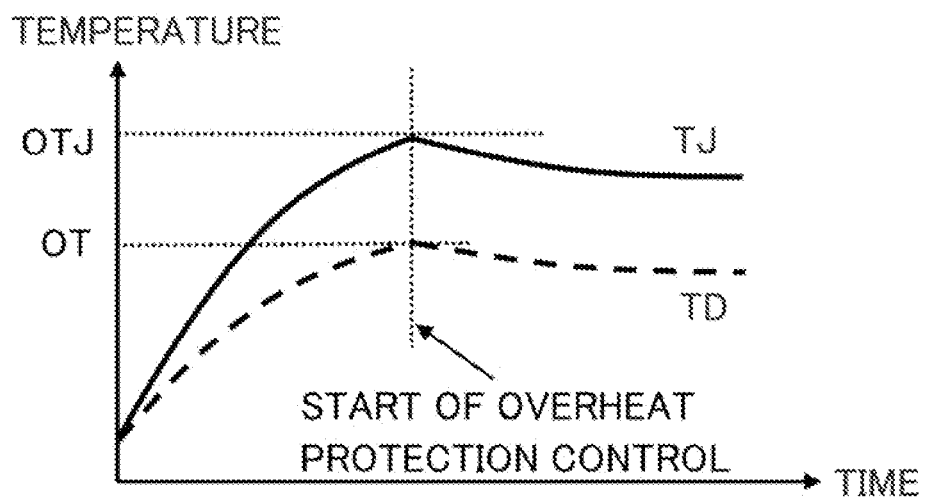
FIG. 9 is a first timing chart showing temperature transitions under prevention of overheating based on the variably-set temperature threshold value, with respect to the electric-power conversion apparatus according to Embodiment 1.
Figure 10:
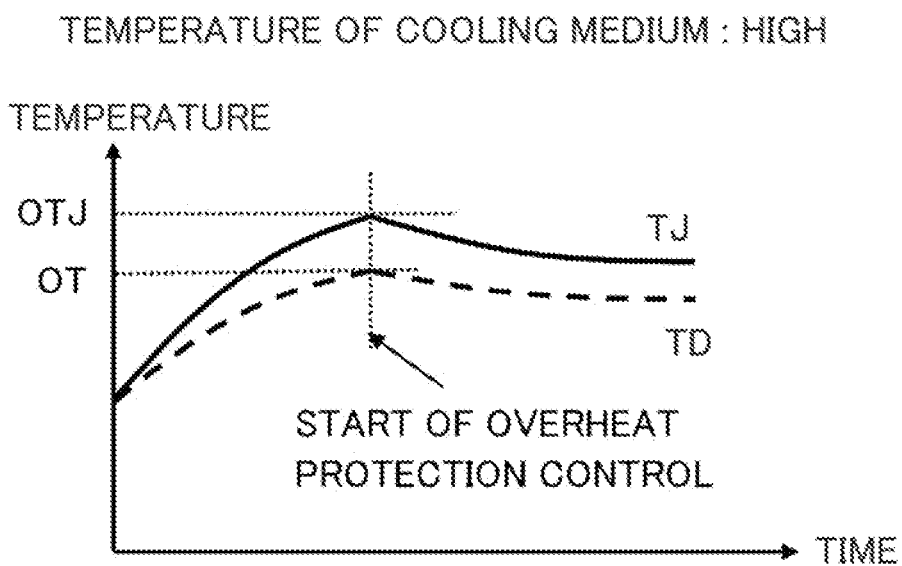
FIG. 10 is a second timing chart showing temperature transitions under prevention of overheating based on the variably-set temperature threshold value, with respect to the electric-power conversion apparatus according to Embodiment 1.

FIG. 9 is a first timing chart showing temperature transitions under prevention of overheating based on a variably-set temperature threshold value OT, with respect to the electric-power conversion apparatus 100 according to Embodiment 1. FIG. 10 is a second timing chart showing temperature transitions under prevention of overheating based on the variably-set temperature threshold value OT.

FIGS. 9 and 10 are timing charts of the junction portion temperature TJ about the semiconductor switching devices 51 to 56 and the detection temperature TD according to the device temperature detectors 71 to 76, when overheat protection control based on the variably-set temperature threshold value OT is applied. FIG. 9 is the timing chart in a case where the electric-power conversion apparatus is driven with a given load from the stopped state when the temperature TW of the cooling medium is low, and FIG. 10 is the timing chart in a case where the electric-power conversion apparatus is driven with the given load from the stopped state when the temperature TW of the cooling medium is high. In each of FIGS. 7 to 10, at the starting point of the graph, the detection temperature TD and the junction portion temperature TJ are both equal to the temperature TW of the cooling medium.

When overheat protection control based on the fixed temperature threshold value OT is applied, overheat protection control is executed using the same temperature threshold value OT as a fixed value, regardless of the temperature of the cooling medium. Thus, as shown in FIG. 8, when the temperature of the cooling medium is high, overheat protection control is activated even though the junction portion temperature TJ about the semiconductor switching devices 51 to 56 is sufficiently lower than the operating limit temperature OTJ. Accordingly, the electric-power conversion apparatus 100 overly restricts the ability of the semiconductor switching devices 51 to 56, and thus cannot fully exert the performance.

In contrast, when overheat protection control based on the variably-set temperature threshold value OT is applied, as shown in FIG. 6, overheat protection control is executed while setting the temperature threshold value OT so that it is low when the temperature TW of the cooling medium is low and it becomes higher as the temperature TW of the cooling medium increases. This results in a behavior that, as shown in FIG. 10, even when the temperature TW of the cooling medium is high, overheat protection control is activated at a state where the junction portion temperature TJ about the semiconductor switching devices 51 to 56 reaches a temperature near the operating limit temperature OTJ.

Figure 11:
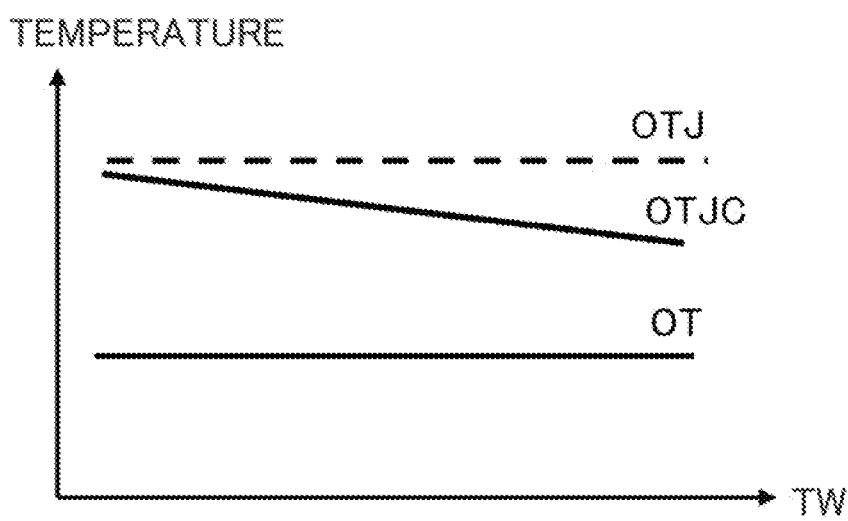
FIG. 11 is a graph showing a relationship between a temperature of the cooling medium and a device temperature under prevention of overheating based on the fixed temperature threshold value, with respect to the electric-power conversion apparatus according to Embodiment 1.
Figure 12:
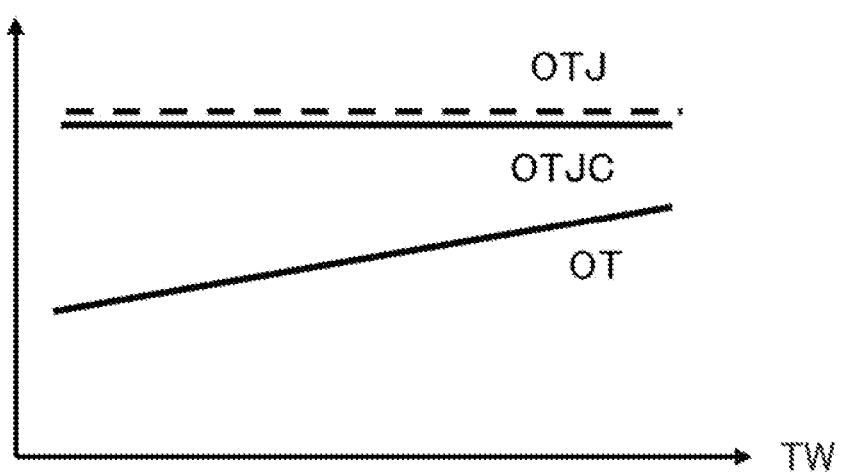
FIG. 12 is a graph showing a relationship between a temperature of the cooling medium and a device temperature under prevention of overheating based on the variably-set temperature threshold value, with respect to the electric-power conversion apparatus according to Embodiment 1.

FIG. 11 is a graph showing a relationship between the temperature TW of the cooling medium and the device temperature under prevention of overheating based on the fixed temperature threshold value OT, with respect to the electric-power conversion apparatus 100 according to Embodiment 1. FIG. 12 is a graph showing a relationship between the temperature TW of the cooling medium and the device temperature under prevention of overheating based on the variably-set temperature threshold value OT. FIGS. 11 and 12 each show a relationship relative to the temperature TW of the cooling medium, of the temperature threshold value OT set for overheat protection control, a maximum junction portion temperature OTJC of the semiconductor switching device as an actually restricted temperature achieved when overheat protection control is applied, and the operating limit temperature OTJ of the semiconductor switching device.

According to the overheat protection control based on the fixed temperature threshold value OT, as shown in FIG. 11, such a temperature threshold value OT for overheat protection control is employed that is constant regardless of the temperature of the cooling medium. Thus, when the temperature TW of the cooling medium is high, the actually-restricted maximum junction portion temperature OTJC about the semi-conductor switching devices 51 to 56 is given as a temperature lower than the operating limit temperature OTJ. Said differently, when the temperature TW of the cooling medium is high, a behavior may occur that overheat protection control is unduly executed even though there is a margin from the operating limit temperature OTJ.

In contrast, according to the overheat protection control based on the variably-set temperature threshold value OT, as shown in FIG. 12, such a temperature threshold value OT for overheat protection control is employed that becomes higher as the temperature of the cooling medium increases. Thus, even when the temperature TW of the cooling medium is high, the actually-restricted maximum junction portion temperature OTJC about the semiconductor switching devices 51 to 56 is given as a temperature near the operating limit temperature OTJ. Said differently, it is possible to provide an efficient electric-power conversion apparatus which suppresses unduly restricting the output of the electric-power conversion apparatus while preventing the semiconductor switching devices 51 to 56 from exceeding the operating limit temperature OTJ, even when the temperature TW of the cooling medium is high.

SUMMARY

As described above, the electric-power conversion apparatus 100 according to Embodiment 1 has, as a cooling-medium state detection means that detects a state of the cooling medium flowing in the cooler 351, the water temperature sensor 36 that detects the temperature of the cooling medium, and sets the temperature threshold value OT for overheat protection control on the basis of the temperature TW of the cooling medium. Thus, such a configuration can be employed in which the temperature threshold value OT for overheat protection control is set so that it become higher as the temperature TW of the cooling medium increases. Accordingly, it is possible to provide an efficient electric-power conversion apparatus which suppresses unduly restricting the output of the electric-power conversion apparatus while appropriately preventing overheating of the semiconductor switching devices 51 to 56.

It is noted that, as described previously, the semiconductor switching devices 51 to 56 in the inverter circuit 25 may be composed using any type of semiconductor device. For example, they may be composed using a wide bandgap semiconductor. Examples of the material of the wide bandgap semiconductor include SiC, GaN and the like.

As compared with conventional switching devices composed using a semiconductor of silicon, the semiconductor switching devices 51 to 56 composed using the wide bandgap semiconductor have improved heat resistance and thus allow the operating limit temperature OTJ to be set higher. Namely, according to the wide bandgap semiconductor, as compared with the conventional semiconductor of silicon, the difference between the operating limit temperature OTJ and the temperature TW of the cooling medium is larger and thus the allowable temperature-rise amount is larger.

According to this case, the gap between the temperature of the semiconductor switching device and the detection temperature TD according to the device temperature detector also becomes larger relatively. Accordingly, a highest-lowest difference of the temperature threshold value OT for overheat protection control, that is due to level of the temperature TW of the cooling medium, also becomes larger. Namely, according to the electric-power conversion apparatus using the switching devices composed of a wide bandgap semiconductor, when, as featured in this embodiment, the temperature threshold value OT is set so that it varies on the basis of the temperature TW of the cooling medium, it is possible to prevent unduly restricting the output of the electric-power conversion apparatus, more effectively.

It is further noted that the device temperature detectors 71 to 76 that detect the temperatures of the semiconductor switching devices 51 to 56 are herein assumed to be thermistors, temperature detection diodes or the like. Though depending on the position where the device temperature detector is mounted, a temperature detection responsiveness of the thermistor is generally lower than that of the temperature detection diode, so that the gap between the temperature of the semiconductor switching device and the detection temperature TD according to the device temperature detector is relatively larger when the thermistor is used than when the temperature detection diode is used. Accordingly, a highest-lowest difference of the temperature threshold value for overheat protection control, that is due to level of the temperature of the cooling medium, also becomes larger. Thus, according to the electric-power conversion apparatus that is configured using the thermistor as the device temperature detector, when, as featured in this embodiment, the temperature threshold value is set so that it varies on the basis of the temperature of the cooling medium, it is possible to prevent unduly restricting the output of the electric-power conversion apparatus, more effectively.

Second Example

Figure 13:
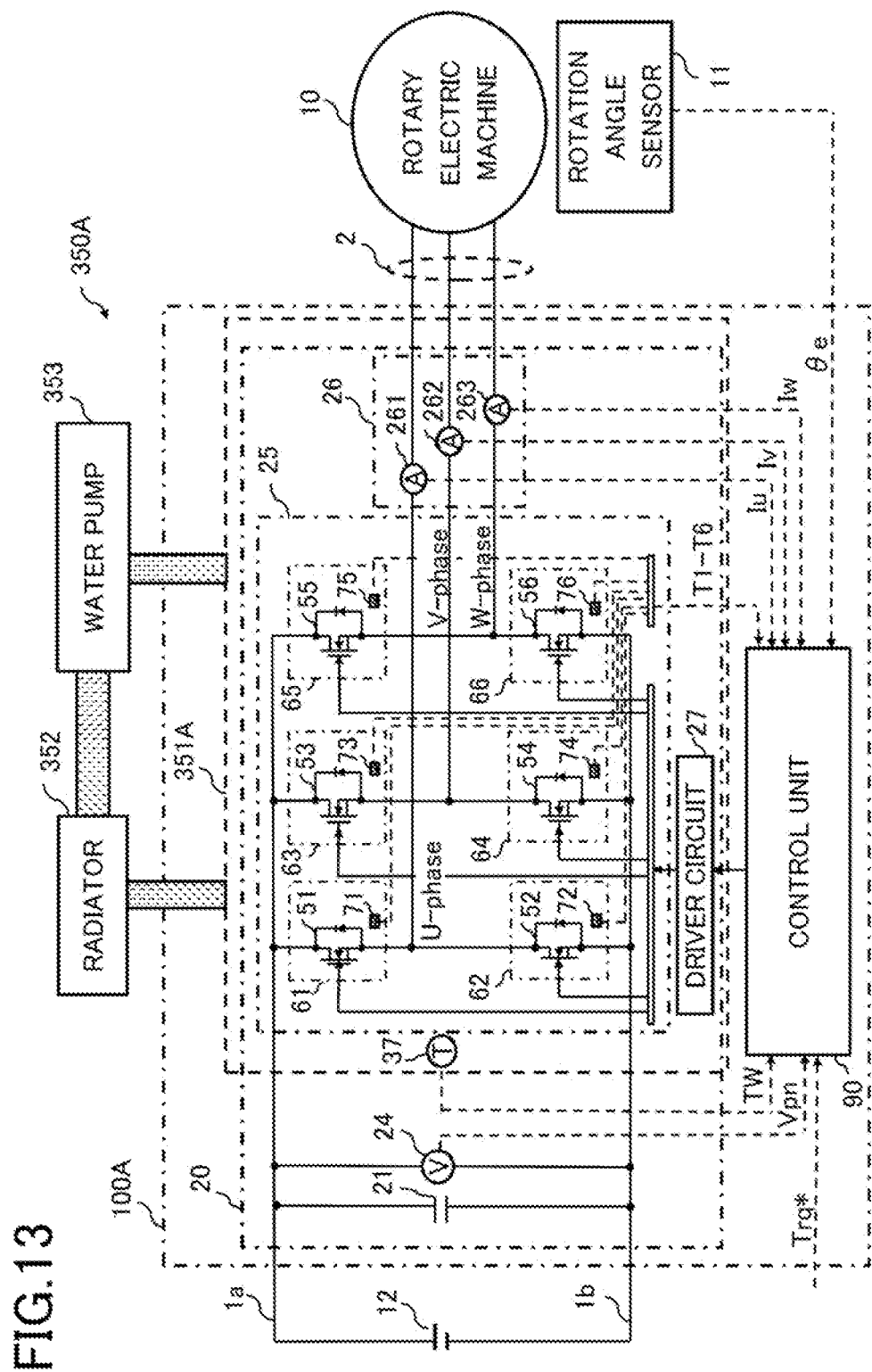
FIG. 13 is a configuration diagram of a second example of the electric-power conversion apparatus according to Embodiment 1.

FIG. 13 is a configuration diagram of a second example of the electric-power conversion apparatus according to Embodiment 1. The foregoing electric-power conversion apparatus 100 is exemplified as including the water temperature sensor 36 as a cooling-medium state detection means. The description has been made about a system in which the temperature of the cooling medium is detected as a state of the cooling medium by the water temperature sensor 36, and the temperature threshold value OT for overheat protection control is set so that it becomes higher as the temperature of the cooling medium increases.

An electric-power conversion apparatus 100A of FIG. 13 is configured to include, instead of the water temperature sensor 36, a cooler temperature sensor 37 that detects the temperature of a cooler 351A. Thus, another system may be employed which includes the cooler temperature sensor 37 as a cooling-medium state detection means and in which the temperature of the cooler 351A is detected as a state of the cooling medium by the cooler temperature sensor 37, and the temperature threshold value OT for overheat protection control is set so that it becomes higher as the temperature of the cooler increases. Note that, since the control unit 90 here can be implemented without requiring hardware change and only through software change from the foregoing control unit, the same reference numeral as in FIG. 1 is given thereto. The same applies hereinafter to the control units 90 according to the third example to sixth example.

The higher the temperature TW of the cooling medium is, the higher the temperature of the cooler 351A becomes. Thus, even when such a system is employed in which the temperature threshold value OT for overheat protection control is set so that it becomes higher as the temperature of the cooler 351A increases, an effect of preventing unduly restricting the output of the electric-power conversion apparatus 100A, that is to be achieved when the temperature threshold value OT for overheat protection control is set so that it becomes higher as the temperature TW of the cooling medium increases, will be achieved similarly.

It is further noted that, in this Embodiment, a configuration including the water temperature sensor 36 or the cooler temperature sensor 37 as a cooling-medium state detection means, is employed. However, the electric-power conversion apparatus does not necessarily include the water temperature sensor 36 or the cooler temperature sensor 37. For example, temperature information of the cooling medium may be inputted to the electric-power conversion apparatus from an external system such as an upper-level system (not illustrated) through communication.

Third Example

Figure 14:
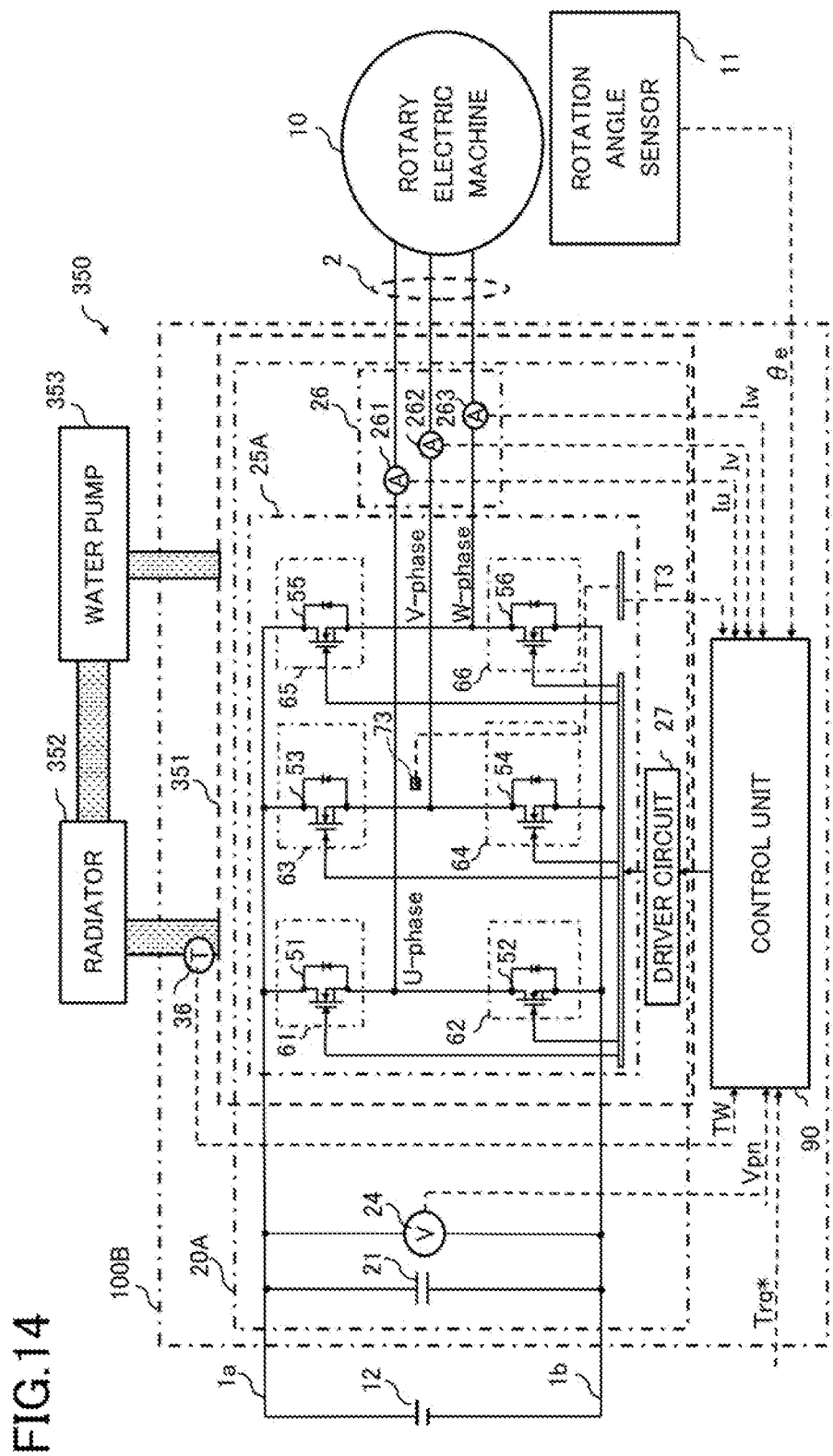
FIG. 14 is a configuration diagram of a third example of the electric-power conversion apparatus according to Embodiment 1.

FIG. 14 is a configuration diagram of a third example of the electric-power conversion apparatus according to Embodiment 1. According to the semiconductor modules 61 to 66 in the electric-power conversion apparatus 100 of FIG. 1, the device temperature detectors 71 to 76 are provided for the semiconductor switching devices 51 to 56, respectively. In contrast, in an electric-power conversion apparatus 100B according to the third example shown in FIG. 14, a single device temperature detector 73 is provided for the multiple semiconductor switching devices 51 to 56. Because of this configuration change, the reference numerals of the electric-power conversion unit and the inverter circuit are changed to 20 A and 25 A, respectively.

In this case, the device temperature detector 73 is placed at a specified place correlated to the temperatures of the semiconductor switching devices 51 to 56. This makes it possible to achieve the protection of the multiple semiconductor switching devices 51 to 56 by using the single device temperature detector 73. Thus, overheat protection can be carried out with a reduced number of parts, and thus it is possible to achieve cost reduction and downsizing of the electric-power conversion apparatus.

Fourth Example

Figure 15:
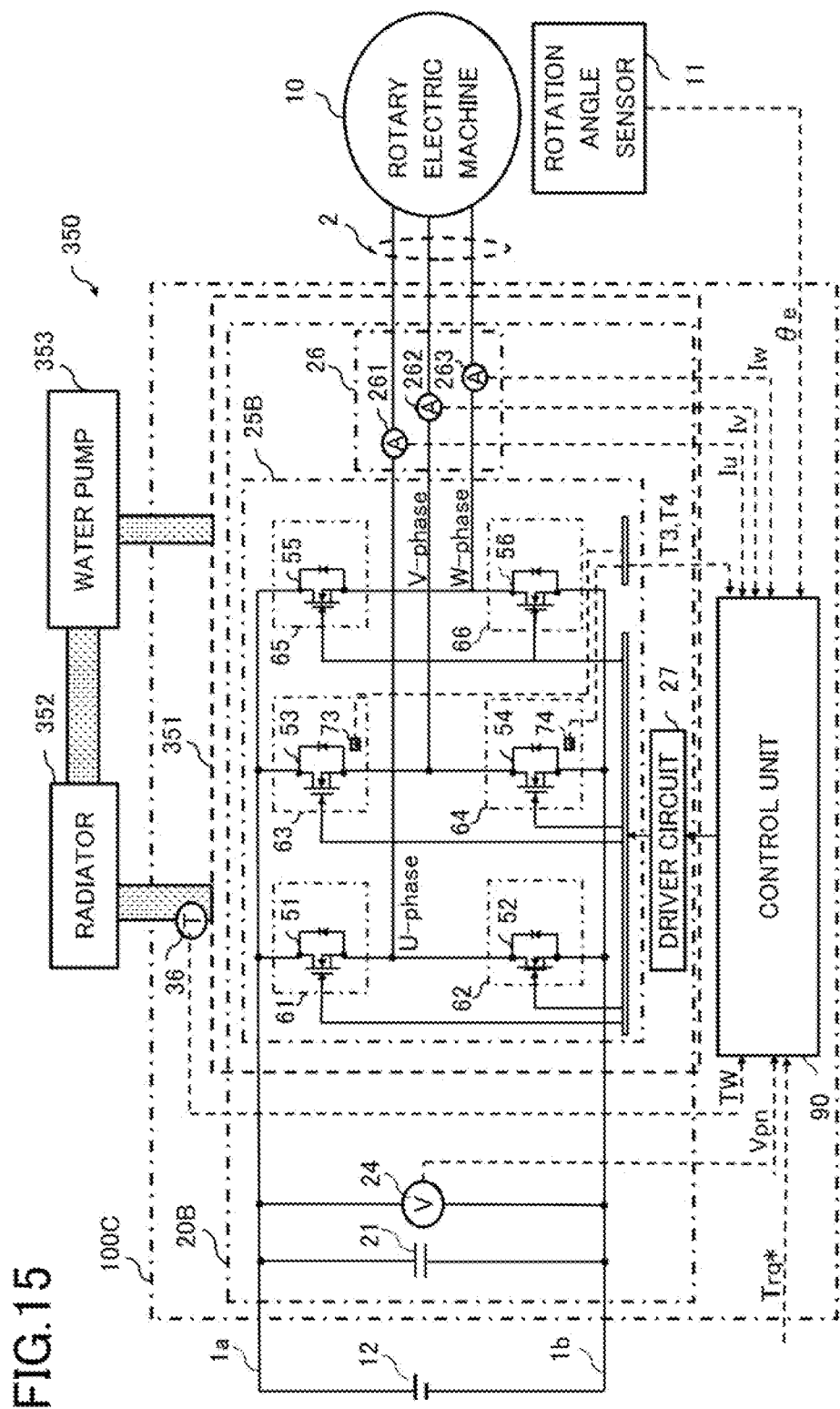
FIG. 15 is a configuration diagram of a fourth example of the electric-power conversion apparatus according to Embodiment 1.

FIG. 15 is a configuration diagram of a fourth example of the electric-power conversion apparatus according to Embodiment 1. The semiconductor modules 61 to 66 in the electric-power conversion apparatus 100B according to the third example are configured with the multiple semiconductor switching devices and the single device temperature detector.

In contrast, in an electric-power conversion apparatus 100C according to the fourth example shown in FIG. 15, the semiconductor power modules 61, 63 and 65 are configured with the upper-side semiconductor switching devices 51, 53 and 55 and a single device temperature detector 73, and the semiconductor power modules 62, 64 and 66 are configured with the lower-side semiconductor switching devices 52, 54 and 56 and a single device temperature detector 74. Because of this configuration change, the reference numerals of the electric-power conversion unit and the inverter circuit are changed to 20 B and 25 B, respectively.

Accordingly, the device temperature detectors 73, 74 could be placed on the upper side and the lower side, respectively, so that the temperature detection can be carried out more minutely. Further, the protection of multiple semiconductor switching devices can be achieved by using the single device temperature detector, so that overheat protection can be carried out with a reduced number of parts and thus an effect that makes it possible to achieve cost reduction and downsizing of the electric-power conversion apparatus can also be ensured.

Fifth Example

Figure 16:
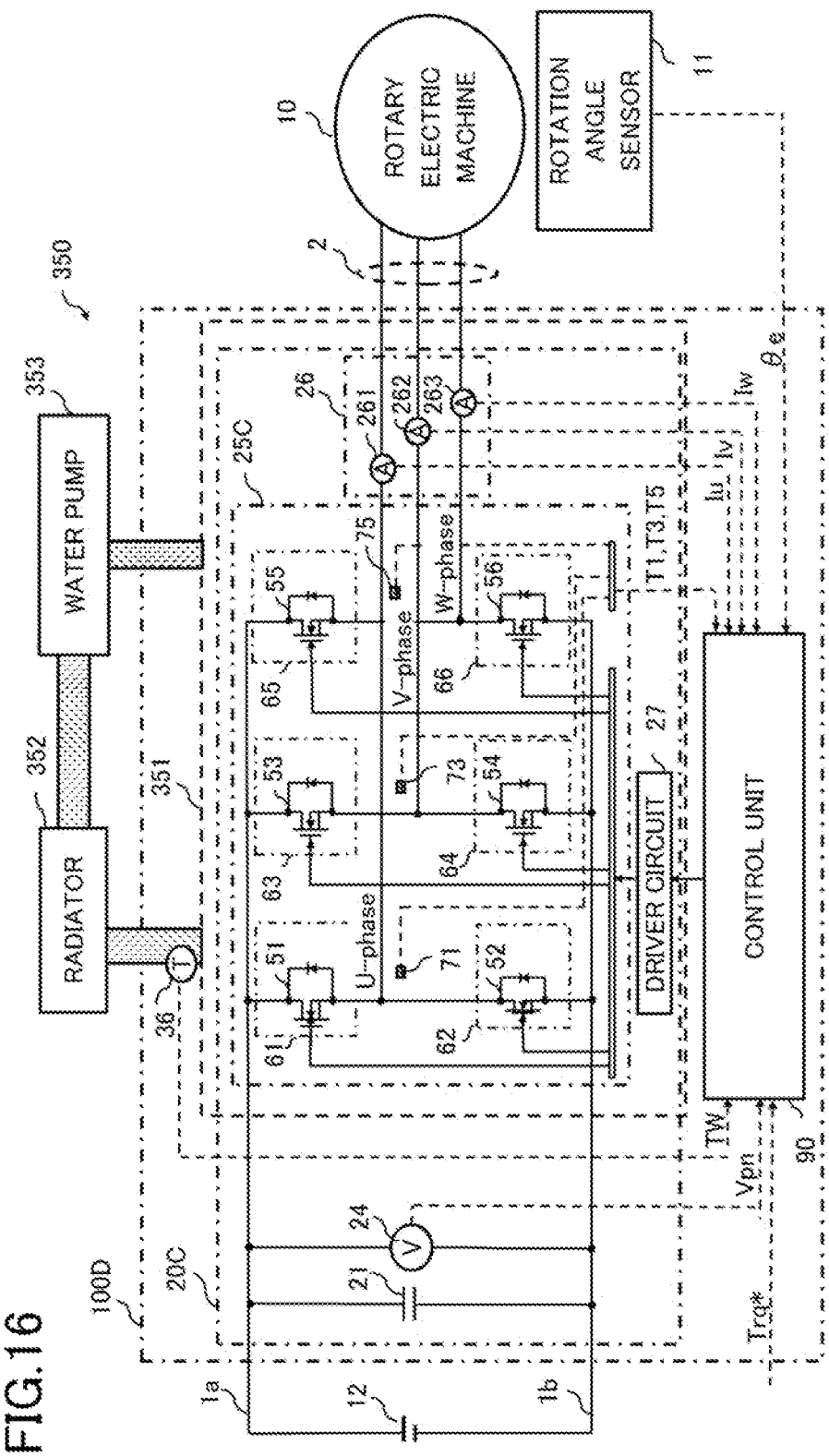
FIG. 16 is a configuration diagram of a fifth example of the electric-power conversion apparatus according to Embodiment 1.

FIG. 16 is a configuration diagram of a fifth example of the electric-power conversion apparatus according to Embodiment 1. In an electric-power conversion apparatus 100D according to the fifth example, each one of the vertical arms is configured with an upper-side switching device, a lower-side switching device and a single device temperature detector. Because of this configuration change, the reference numerals of the electric-power conversion unit and the inverter circuit are changed to 20 C and 25 C, respectively.

Since the device temperature detector is provided per one vertical arm, the temperature detection can be carried out more minutely. Further, the protection of multiple semiconductor switching devices can be achieved by using the single device temperature detector, so that overheat protection can be carried out with a reduced number of parts and thus an effect that makes it possible to achieve cost reduction and downsizing of the electric-power conversion apparatus can also be ensured.

Sixth Example

Figure 17:
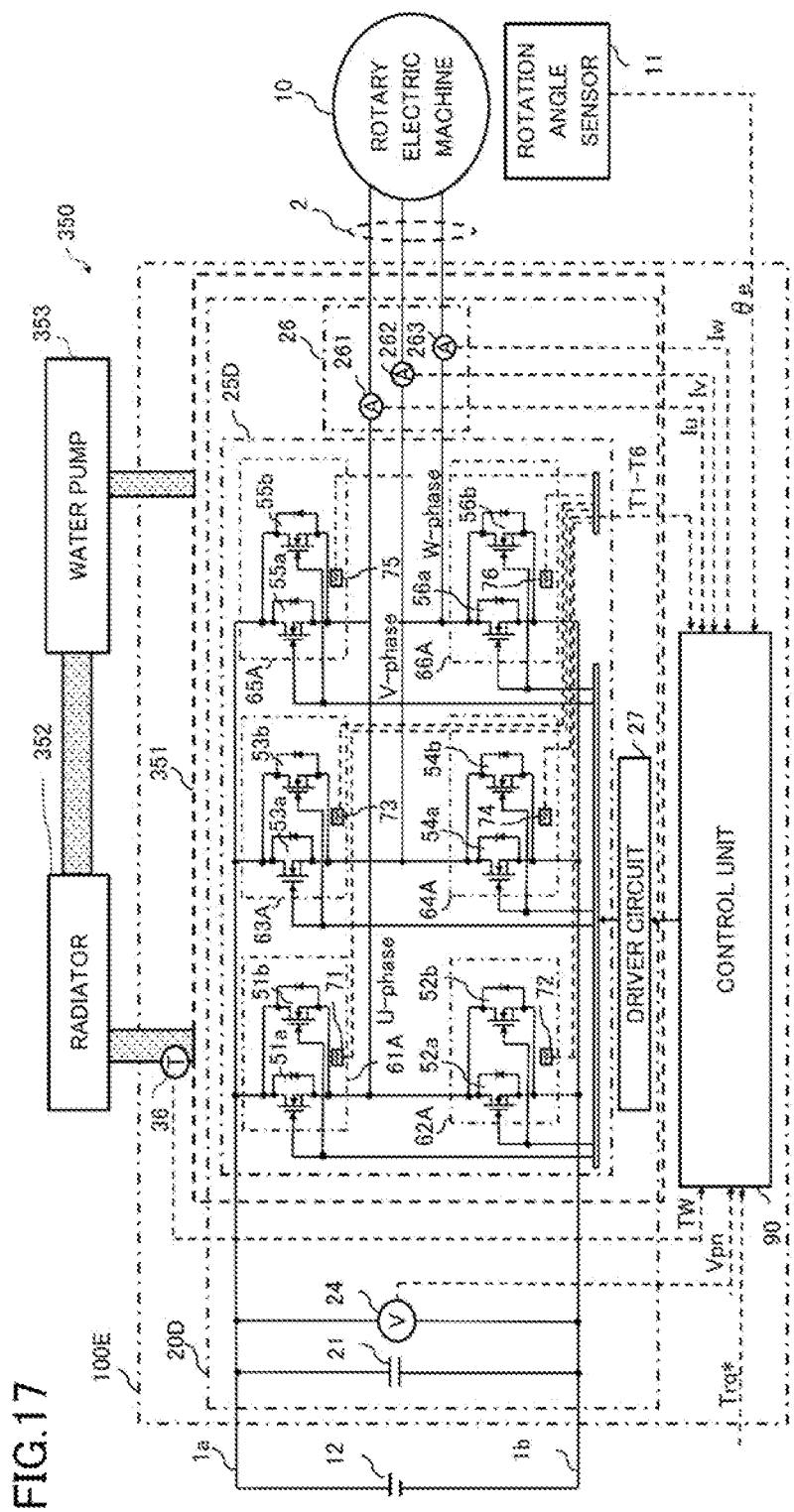
FIG. 17 is a configuration diagram of a sixth example of the electric-power conversion apparatus according to Embodiment 1.

FIG. 17 is a configuration diagram of a sixth example of the electric-power conversion apparatus according to Embodiment 1. The semiconductor modules 61 to 66 in the electric-power conversion apparatus 100 according to the first example are each configured with a single semiconductor switching device and a single device temperature detector.

In contrast, in an electric-power conversion apparatus 100E according to the sixth example shown in FIG. 17, semiconductor modules 61A to 66A are each configured with multiple semiconductor switching devices (51a and 51b . . . or 56a and 56b) and a single device temperature detector (71 . . . or 76). Because of this configuration change, the reference numerals of the electric-power conversion unit and the inverter circuit are changed to 20D and 25D, respectively.

Accordingly, even with a configuration in which multiple switching devices (51a and 51b . . . or 56a and 56b) are embedded in each of the semiconductor modules 61A to 66A, the protection of the multiple semiconductor switching devices can be achieved by using the single device temperature detector. Thus, overheat protection can be carried out with a reduced number of parts, and thus it is possible to achieve cost reduction and downsizing of the electric-power conversion apparatus.

2. Embodiment 2

<Configuration of Electric-Power Conversion Apparatus>

Figure 18:
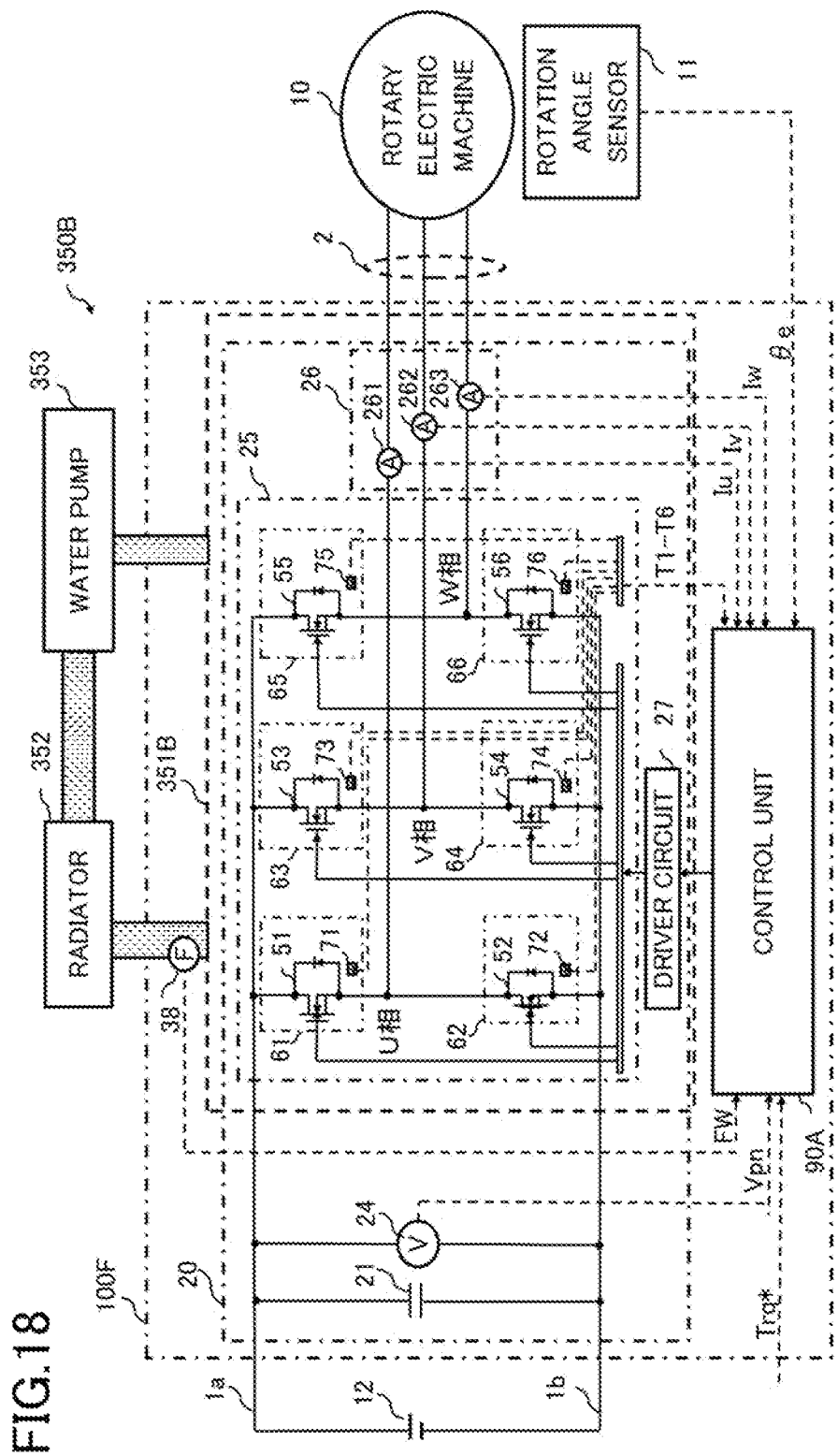
FIG. 18 is a configuration diagram of an electric-power conversion apparatus according to Embodiment 2.

FIG. 18 is a configuration diagram of an electric-power conversion apparatus 100F according to Embodiment 2. The electric-power conversion apparatus 100F according to Embodiment 2 differs in its cooling-medium state detection means and control unit 90A from the electric-power conversion apparatus 100 of FIG. 1 according to Embodiment 1.

More specifically, the electric-power conversion apparatus 100F of Embodiment 2 includes, in its cooler 351B, a flow rate sensor 38 that detects a flow rate of the cooling medium, instead of the water temperature sensor 36, as a cooling-medium state detection means. The control unit 90A imports a flow rate FW of the cooling medium detected by the flow rate sensor 38. Then, the control unit 90A sets a temperature threshold value OT on the basis of the flow rate FW of the cooling medium.

In the following, based on FIG. 18 to FIG. 28, the configuration and operations of the electric-power conversion apparatus 100F according to Embodiment 2 will be described focusing on differences from Embodiment 1. Note that parts same as or equivalent to those in Embodiment 1 are denoted by the same reference numerals.

The electric-power conversion apparatus 100F is configured with the electric-power conversion unit 20, the control unit 90A and the cooler 351B. The flow rate sensor 38 detects the flow rate FW of the cooling medium flowing in the cooling water pipeline and outputs it to the control unit 90A. The flow rate sensor 38 is, for example, located in the cooling water pipeline of the cooler 351B.

<Function Blocks of Control Unit>

Figure 19:
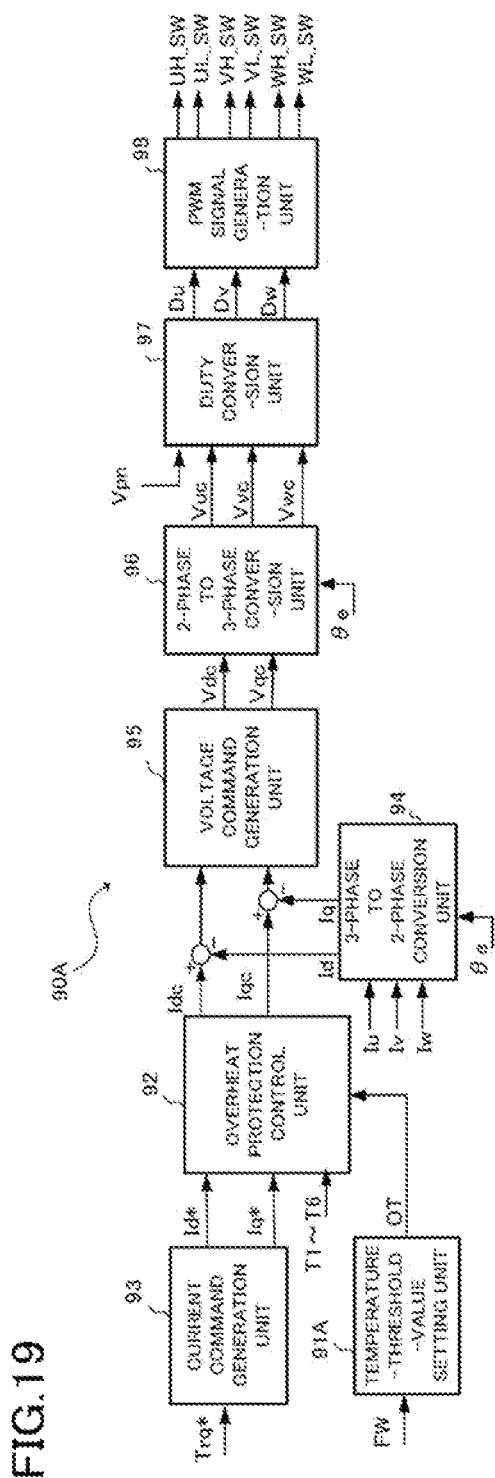
FIG. 19 is a function block diagram of a control unit in the electric-power conversion apparatus according to Embodiment 2.

FIG. 19 is a function block diagram of the control unit 90A in the electric-power conversion apparatus 100F according to Embodiment 2. The control unit 90A has: a temperature-threshold-value setting unit 91A; an overheat protection control unit 92; a current command generation unit 93; a three-phase to two-phase conversion unit 94; a voltage command generation unit 95; a two-phase to three-phase conversion unit 96; a duty conversion unit 97; and a PWM signal generation unit 98. The overheat protection control unit 92, the current command generation unit 93, the three-phase to two-phase conversion unit 94, the voltage command generation unit 95, the two-phase to three-phase conversion unit 96, the duty conversion unit 97, and the PWM signal generation unit 98 are the same as those in Embodiment 1, so that description thereof will be omitted.

The temperature-threshold-value setting unit 91A has, as a feature of this application, a function of calculating a temperature threshold value used for executing overheat protection control, on the basis of a state of the cooling medium. From the flow rate sensor 38, the flow rate FW of the cooling medium is inputted to the temperature-threshold-value setting unit 91A. On the basis of the flow rate FW of the cooling medium, the temperature threshold value OT used for executing overheat protection control is calculated. Then, the thus-calculated temperature threshold value OT is outputted to the overheat protection control unit 92. Details of the temperature-threshold-value setting unit 91A will be described later.

The electric-power conversion apparatus 100F according to Embodiment 2 is characterized in that: the temperature-threshold-value setting unit 91A and the overheat protection control unit 92 are provided in the control unit 90A; the temperature threshold value OT is set by the temperature-threshold-value setting unit 91A on the basis of the flow rate FW of the cooling medium; and the d-axis current command value and the q-axis current command value are restricted to the specified current command values by the overheat protection control unit 92 on the basis of comparison between the temperature detection values T1 to T6 and the temperature threshold value OT. In addition, the electric-power conversion apparatus 100F according to Embodiment 2 is characterized in that the temperature-threshold-value setting unit 91A sets the temperature threshold value OT so that it becomes higher as the flow rate FW of the cooling medium increases.

<Cases where Temperature Threshold Value OT is Fixed Value>

Here, an effect created by the method of setting the temperature threshold value OT on the basis of the temperature TW of the cooling medium, that is a feature of the electric-power conversion apparatus 100F according to Embodiment 2, will be explained. First, description will be made about a problem that may arise when the temperature threshold value OT is set as a fixed value.

Specifically, using FIGS. 20 and 21, a case will be described where, when the temperature threshold value OT is a fixed value, depending on a state of the cooling medium, even though the semiconductor switching devices are in a state in which temperature rise of them is still allowed, the output is unduly restricted.

Figure 20:
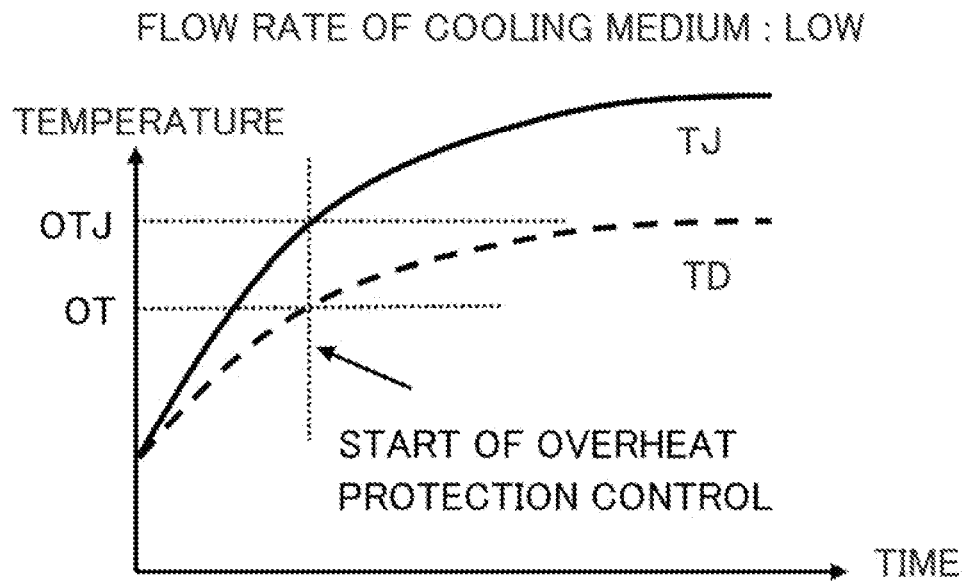
FIG. 20 is a first graph illustrating a relationship between a fixed temperature threshold value and a device temperature, with respect to the electric-power conversion apparatus according to Embodiment 2.

FIG. 20 is a first graph illustrating a relationship between a fixed temperature threshold value OT and a detection temperature TD, with respect to the electric-power conversion apparatus 100F according to Embodiment 2. FIG. 21 is a second graph illustrating a relationship between the fixed temperature threshold value OT and a detection temperature TD.

The cooling medium is a liquid such as water, an oil, an LLC or the like. FIG. 20 is a graph schematically showing a timing chart of the junction portion temperature TJ about the semiconductor switching devices 51 to 56 and the detection temperature TD according to the device temperature detectors 71 to 76, in a case where the electric-power conversion apparatus 100F is driven with a given load from the stopped state when the flow rate of the cooling medium is small.

Figure 21:
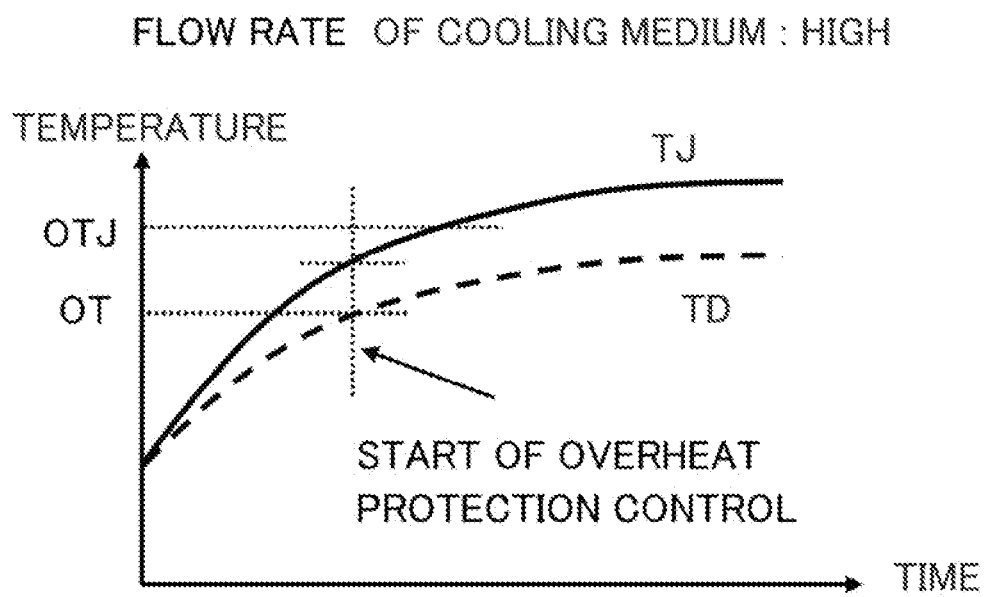
FIG. 21 is a second graph illustrating a relationship between the fixed temperature threshold value and a device temperature, with respect to the electric-power conversion apparatus according to Embodiment 2.

FIG. 21 is a graph schematically showing a timing chart of the junction portion temperature TJ about the semiconductor switching devices 51 to 56 and the detection temperature TD according to the device temperature detectors 71 to 76, in a case where the electric-power conversion apparatus 100F is driven with the given load from the stopped state when the flow rate of the cooling medium is large.

It is noted that, as the timing chart of the device junction portion temperature TJ and the detection temperature TD, in each of FIGS. 20 and 21, such a temperature timing chart is shown that is obtained when no overheat protection control is executed, in order to make the difference in temperature rise due to level of the flow rate of the cooling medium easy to understand. In each of FIGS. 20 and 21, at the starting point of the graph, the detection temperature TD and the junction portion temperature TJ are both equal to the temperature TW of the cooling medium.

With respect to the electric-power conversion apparatus 100F provided with the cooler 351B that cools down the heating devices as the semiconductor switching devices 51 to 56, etc., when the flow rate of the cooling medium is small, the cooling capability is reduced as compared with the case where the flow rate of the cooling medium is large. Accordingly, as shown in FIG. 20, as compared with the case where the flow rate of the cooling medium is large, even when the semiconductor switching devices are driven with the same power loss, the temperature rise of the semiconductor switching devices 51 to 56 is steeper.

As has been described in Embodiment 1, there is a gap between the detection temperature TD of the semiconductor switching devices 51 to 56 and the true junction portion temperature TJ about the semi-conductor switching devices 51 to 56. Further, there is also a time delay (response delay) until the detection temperature TD of the semiconductor switching devices 51 to 56 gets equal to the temperature of the measuring object. Thus, as shown in FIG. 20, in the case where the temperature rise of the semiconductor switching devices 51 to 56 is steep, the gap between the true device junction portion temperature TJ about the semiconductor switching devices and the detection temperature TD according to the device temperature detectors 71 to 76 is larger as compared with the case where the temperature rise is moderate.

Accordingly, when the flow rate of the cooling medium is small, the detection temperature TD according to the device temperature detectors 71 to 76 at the time the junction portion temperature TJ about the semiconductor switching devices 51 to 56 reaches the operating limit temperature OTJ, has a value that is lower as compared with the case where the flow rate is large. It is necessary to set the temperature at that time at which overheat protection is to be started, as the temperature threshold value OT.

The output of the electric-power conversion apparatus 100F is reduced when the detection temperature TD exceeds a specified temperature threshold value OT, to thereby prevent overheat breakage of the semiconductor switching devices 51 to 56. According to a comparative example in which the temperature threshold value OT is set as a fixed value, it is necessary to set the temperature threshold value OT so as to be matched with the case where the flow rate of the cooling medium is small (the cooling capability is low). The detection temperature TD according to the device temperature detectors 71 to 76 at the time the junction portion temperature TJ about the semiconductor switching devices 51 to 56 reaches the operating limit temperature OTJ, is set as the temperature threshold value OT.

Namely, as shown in FIG. 21, when the flow rate of the cooling medium is large (the cooling capability is high), overheat protection will be initiated in a state in which the junction portion temperature TJ about the semiconductor switching devices 51 to 56 does not yet reach the operating limit temperature OTJ and thus temperature rise of them is still allowed. This is because the detection temperature TD according to the device temperature detectors 71 to 76 exceeds the temperature threshold value OT, and this results in an operation by which overheat protection is excessively executed.

<Cases where Temperature Threshold Value OT is Set as Variable Value>

Figure 22:
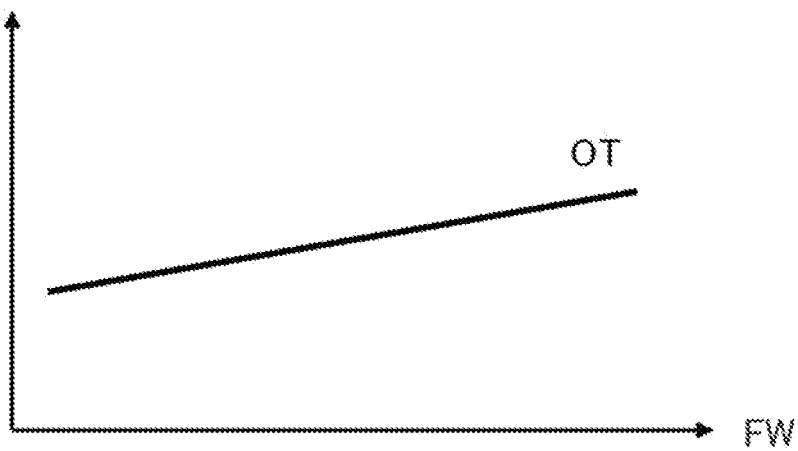
FIG. 22 is a graph illustrating a relationship between a flow rate of a cooling medium and a variably-set temperature threshold value, with respect to the electric-power conversion apparatus according to Embodiment 2.

FIG. 22 is a graph illustrating a relationship between a flow rate FW of the cooling medium and a variably-set temperature threshold value OT, with respect to the electric-power conversion apparatus 100F according to Embodiment 2. The electric-power conversion apparatus 100F is configured to set the temperature threshold value OT at the temperature-threshold-value setting unit 91A, on the basis of the flow rate FW of the cooling medium. Specifically, as shown in FIG. 22, the temperature threshold value OT is set so that it becomes higher as the flow rate FW of the cooling medium increases.

In the following, operations of the temperature-threshold-value setting unit 91A that are features of the electric-power conversion apparatus 100F according to Embodiment 2, will be described. The temperature-threshold-value setting unit 91A uses, as an input, the flow rate FW of the cooling medium from the flow rate sensor 38, to output the temperature threshold value OT used for executing overheat protection control.

The temperature-threshold-value setting unit 91A already includes a threshold-value setting map of temperature threshold values OT relative to flow rates FW of the cooling medium. In order to prevent thermal breakage of the semiconductor switching devices 51 to 56, it is required that the temperature threshold value OT relative to the flow rate FW of the cooling medium be set so that the temperature about the semiconductor switching devices 51 to 56 does not exceed the operating limit temperature OTJ even under severest driving conditions.

Accordingly, the temperature threshold values OT are each determined relative to a flow rate FW of the cooling medium under a situation in which, for every state of the flow rate FW of the cooling medium, the electric-power conversion apparatus 100F is driven under driving conditions that make the power loss at the semiconductor switching devices largest. Further the temperature threshold value OT is set to a temperature that is lower by a predetermined margin than the detection temperature TD of the device temperature detectors 71 to 76 at the time the junction portion temperature TJ about the semiconductor switching devices 51 to 56 reaches the operating limit temperature OTJ.

The detection temperature TD of the device temperature detectors 71 to 76 at the time the junction portion temperature TJ about the semiconductor switching devices reaches the operating limit temperature OTJ, has been described using FIG. 22. In the case where the flow rate of the cooling medium is small, as compared with the case where it is large, the temperature threshold value OT has a lower value. Accordingly, as shown in FIG. 22, the threshold-value setting map of temperature threshold values OT relative to flow rates FW of the cooling medium, is set with a tendency as a feature that the temperature threshold value OT becomes higher as the flow rate FW of the cooling medium increases.

Comparison in Effect

Using FIG. 23 to FIG. 28, the case where the temperature threshold value OT is a fixed value and the case where the temperature threshold value OT is set as a variable value will be compared with each other. The reason why, when the temperature threshold value OT is set to a variable value, the electric-power conversion apparatus can suppress unduly restricting the output of the electric-power conversion apparatus while surely preventing thermal breakage of the semiconductor switching devices, will be described.

Figure 23:
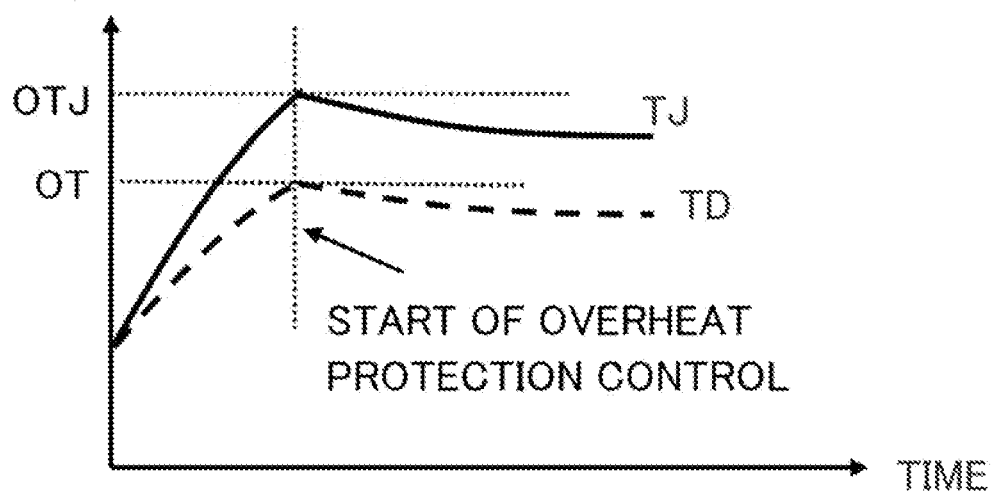
FIG. 23 is a first timing chart showing temperature transitions under prevention of overheating based on the fixed temperature threshold value, with respect to the electric-power conversion apparatus according to Embodiment 2.
Figure 24:
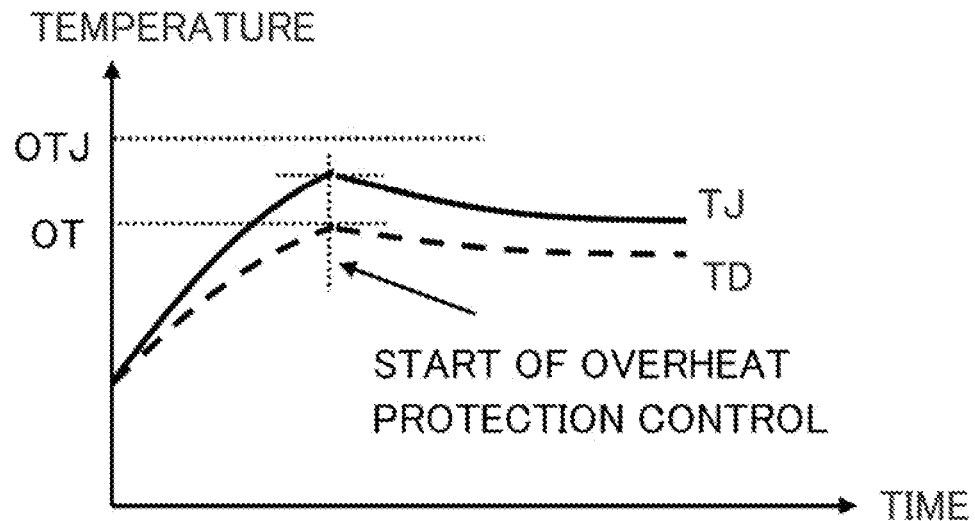
FIG. 24 is a second timing chart showing temperature transitions under prevention of overheating based on the fixed temperature threshold value, with respect to the electric-power conversion apparatus according to Embodiment 2.

FIG. 23 is a first timing chart showing temperature transitions under prevention of overheating based on a fixed temperature threshold value OT, with respect to the electric-power conversion apparatus 100F according to Embodiment 2. FIG. 24 is a second timing chart showing temperature transitions under prevention of overheating based on the fixed temperature threshold value.

FIGS. 23 and 24 are graphs each schematically showing a timing chart of the junction portion temperature TJ about the semiconductor switching devices 51 to 56 and the detection temperature TD according to the device temperature detectors 71 to 76, when overheat protection control based on the fixed temperature threshold value OT is applied. FIG. 23 is the timing chart in a case where the electric-power conversion apparatus is driven with a given load from the stopped state when the flow rate of the cooling medium is small.

FIG. 24 is the timing chart in a case where the electric-power conversion apparatus is driven with the given load from the stopped state when the flow rate of the cooling medium is large. In each of FIGS. 23 and 24, at the starting point of the graph, the detection temperature TD and the junction portion temperature TJ are both equal to the temperature TW of the cooling medium.

Figure 25:
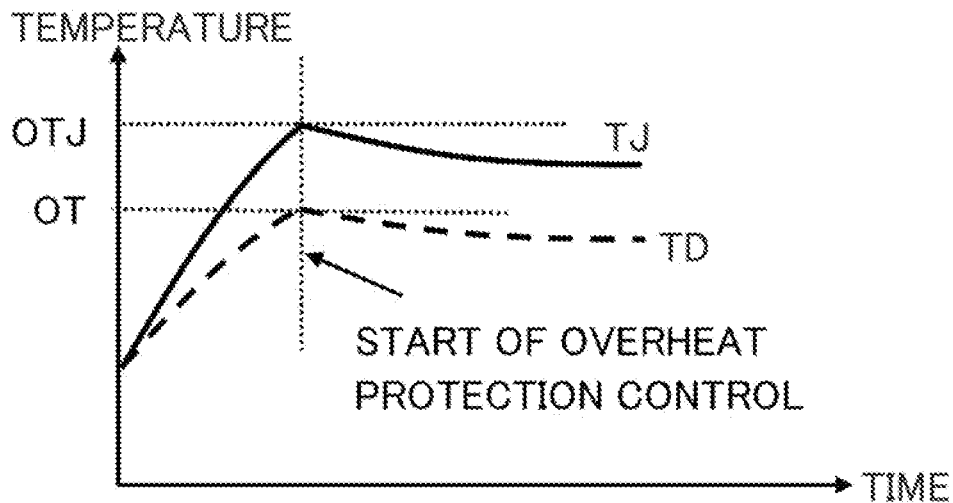
FIG. 25 is a first timing chart showing temperature transitions under prevention of overheating based on the variably-set temperature threshold value, with respect to the electric-power conversion apparatus according to Embodiment 2.
Figure 26:
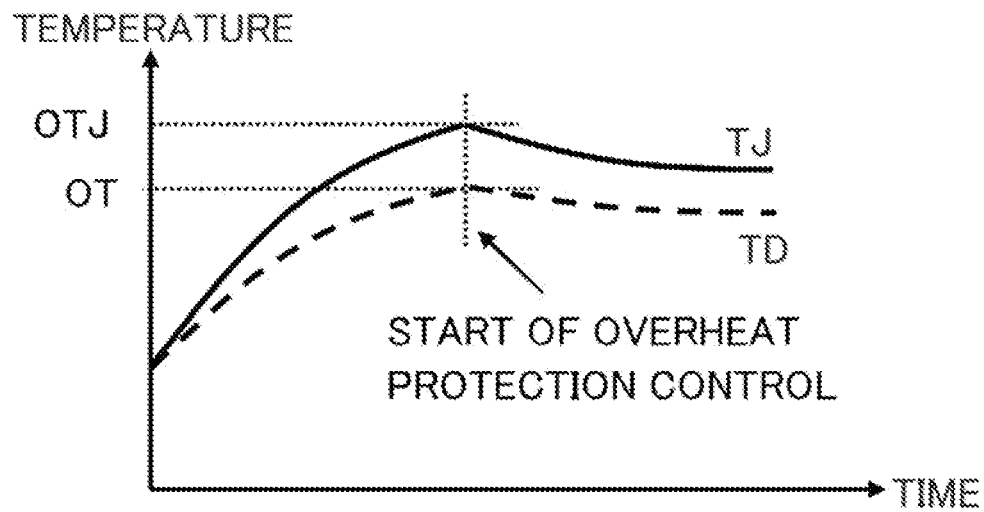
FIG. 26 is a second timing chart showing temperature transitions under prevention of overheating based on the variably-set temperature threshold value, with respect to the electric-power conversion apparatus according to Embodiment 2.

FIG. 25 is a first timing chart showing temperature transitions under prevention of overheating based on a variably-set temperature threshold value OT, with respect to the electric-power conversion apparatus 100F according to Embodiment 2. FIG. 26 is a second timing chart showing temperature transitions under prevention of overheating based on the variably-set temperature threshold value.

FIGS. 25 and 26 are graphs each schematically showing a timing chart of the junction portion temperature TJ about the semiconductor switching devices 51 to 56 and the detection temperature TD according to the device temperature detectors 71 to 76, when overheat protection control based on the variably-set temperature threshold value OT is applied. FIG. 25 is the timing chart in a case where the electric-power conversion apparatus 100F is driven with a given load from the stopped state when the flow rate of the cooling medium is small. FIG. 26 is the timing chart in a case where the electric-power conversion apparatus 100F is driven with the given load from the stopped state when the flow rate of the cooling medium is large. In each of FIGS. 25 and 26, at the starting point of the graph, the detection temperature TD and the junction portion temperature TJ are both equal to the temperature TW of the cooling medium.

When overheat protection control based on the fixed temperature threshold value OT is applied, overheat protection control is executed using the same temperature threshold value OT as a fixed value, regardless of the flow rate FW of the cooling medium. This results in a behavior that, as shown in FIG. 24, when the flow rate of the cooling medium is large, overheat protection control is activated even though the junction portion temperature TJ about the semi-conductor switching devices 51 to 56 is sufficiently lower than the operating limit temperature OTJ.

In contrast, when overheat protection control based on the variably-set temperature threshold value OT is applied, overheat protection control is executed using the temperature threshold value OT that is set so that it becomes higher as the flow rate FW of the cooling medium increases. This results in a behavior that, as shown in FIG. 26, even when the flow rate of the cooling medium is large, overheat protection control is activated at a state where the junction portion temperature TJ about the semiconductor switching devices 51 to 56 reaches a temperature near the operating limit temperature OTJ.

Figure 27:
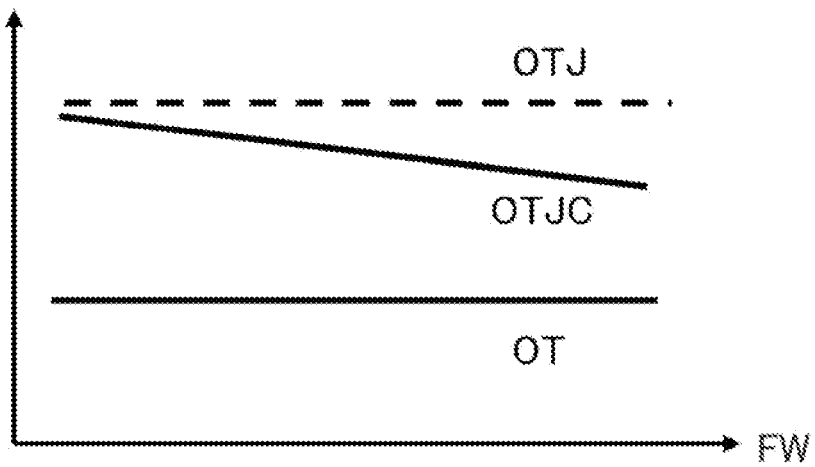
FIG. 27 is a graph showing a relationship between a flow rate of a cooling medium and a device temperature under prevention of overheating based on the fixed temperature threshold value, with respect to the electric-power conversion apparatus according to Embodiment 2.
Figure 28:
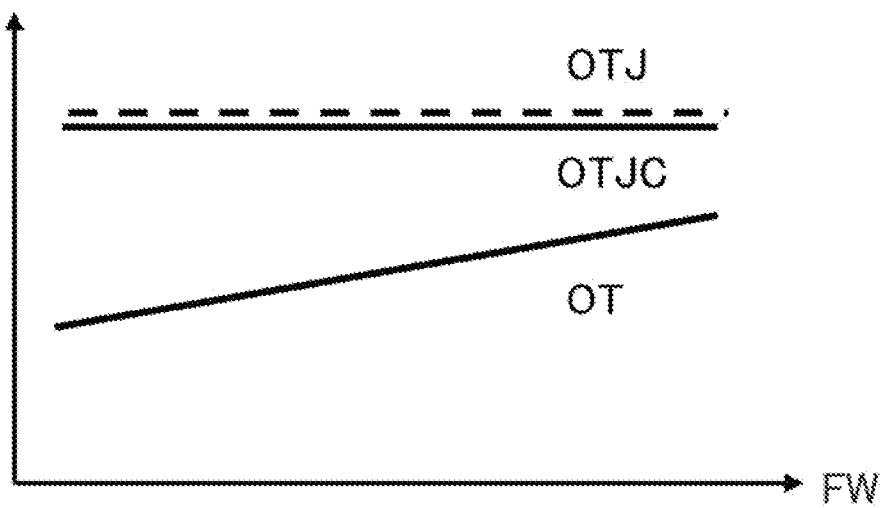
FIG. 28 is a graph showing a relationship between a flow rate of a cooling medium and a device temperature under prevention of overheating based on the variably-set temperature threshold value, with respect to the electric-power conversion apparatus according to Embodiment 2.

FIG. 27 is a graph showing a relationship between the flow rate FW of the cooling medium and the device temperature under prevention of overheating based on the fixed temperature threshold value OT, with respect to the electric-power conversion apparatus 100F according to Embodiment 2. FIG. 28 is a graph showing a relationship between the flow rate FW of the cooling medium and the device temperature under prevention of overheating based on the variably-set temperature threshold value OT.

FIGS. 27 and 28 each shows a relationship relative to the flow rate FW of the cooling medium, of the temperature threshold value OT set for overheat protection control, the maximum junction portion temperature OTJC about the semiconductor switching devices 51 to 56 as an actually restricted temperature achieved when overheat protection control is applied, and the operating limit temperature OTJ about the semiconductor switching devices 51 to 56. FIG. 27 is the graph showing overheat protection control based on the fixed temperature threshold value OT, and FIG. 28 is the graph showing overheat protection control based on the variably-set temperature threshold value OT.

According to the overheat protection control based on the fixed temperature threshold value OT, as shown in FIG. 27, such a temperature threshold value OT for overheat protection control is employed that is constant regardless of the flow rate FW of the cooling medium. Thus, when the flow rate FW of the cooling medium is large, the actually-restricted maximum junction portion temperature OTJC about the semi-conductor switching devices 51 to 56 is given as a temperature lower than the operating limit temperature OTJ. Said differently, when the flow rate FW of the cooling medium is large, a behavior occurs that overheat protection control is unduly executed even though there is a margin from the operating limit temperature OTJ.

In contrast, according to the overheat protection control based on the variably-set temperature threshold value OT, as shown in FIG. 28, such a temperature threshold value OT for overheat protection control is employed that becomes higher as the flow rate FW of the cooling medium increases. Thus, even when the flow rate FW of the cooling medium is large, the actually-restricted maximum junction portion temperature OTJC about the semiconductor switching devices 51 to 56 is given as a temperature near the operating limit temperature OTJ. Said differently, even when the flow rate FW of the cooling medium is large, a behavior occurs that prevents the semiconductor switching devices 51 to 56 from exceeding the operating limit temperature OTJ, without unduly executing overheat protection control.

In the above manner, as a feature of the electric-power conversion apparatus 100F according to Embodiment 2, it is possible to employ such a configuration in which the temperature threshold value OT is set variably on the basis of the flow rate of the cooling medium, and the output of the electric-power conversion apparatus 100F is restricted when the detection temperature TD of the semiconductor switching devices 51 to 56 is higher than the temperature threshold value OT. Accordingly, as compared with an overheat protection method for the semiconductor switching devices that is based on the fixed threshold value OT, it becomes possible to find the overheating state of the semiconductor switching devices 51 to 56 more appropriately, and to suppress unduly restricting the output of the electric-power conversion apparatus 100F while surely preventing thermal breakage of the semiconductor switching devices 51 to 56.

It is noted that the electric-power conversion apparatus 100F according to Embodiment 2 is configured to include the flow rate sensor 38 as a cooling-medium state detection means. However, the electric-power conversion apparatus 100F does not necessarily include the flow rate sensor 38. For example, it may be configured to acquire the flow rate FW of the cooling medium in such a manner that flow-rate information of the cooling medium is inputted to the electric-power conversion apparatus from an external system such as an upper-level system (not illustrated) through communication.

The electric-power conversion apparatus 100F according to Embodiment 2 is characterized in that the temperature threshold value OT for overheat protection control is set on the basis of the flow rate FW of the cooling medium. As a system with which the electric-power conversion apparatus 100F is installed, there is a system in which the water pump 353 is driven intermittently. In that system, the flow rate FW of the cooling medium repeats increasing and decreasing, intermittently. In such a system, a method may be employed in which the temperature threshold value OT for overheat protection control is set on the basis of a flow rate that is small in the increasing and decreasing flow rate FW of the cooling medium. This makes it possible to surely prevent thermal breakage of the semiconductor switching devices.

It is noted that the setting method of the temperature threshold value OT for overheat protection control in the case where the water pump 353 is driven intermittently, is not limited to the above method. For example, such a method may be employed in which the temperature threshold value OT for overheat protection control is set on the basis of an average flow rate of the increasing and decreasing flow rate. This makes it possible to suppress unduly restricting the output of the electric-power conversion apparatus 100F more appropriately.

3. Embodiment 3

Figure 29:
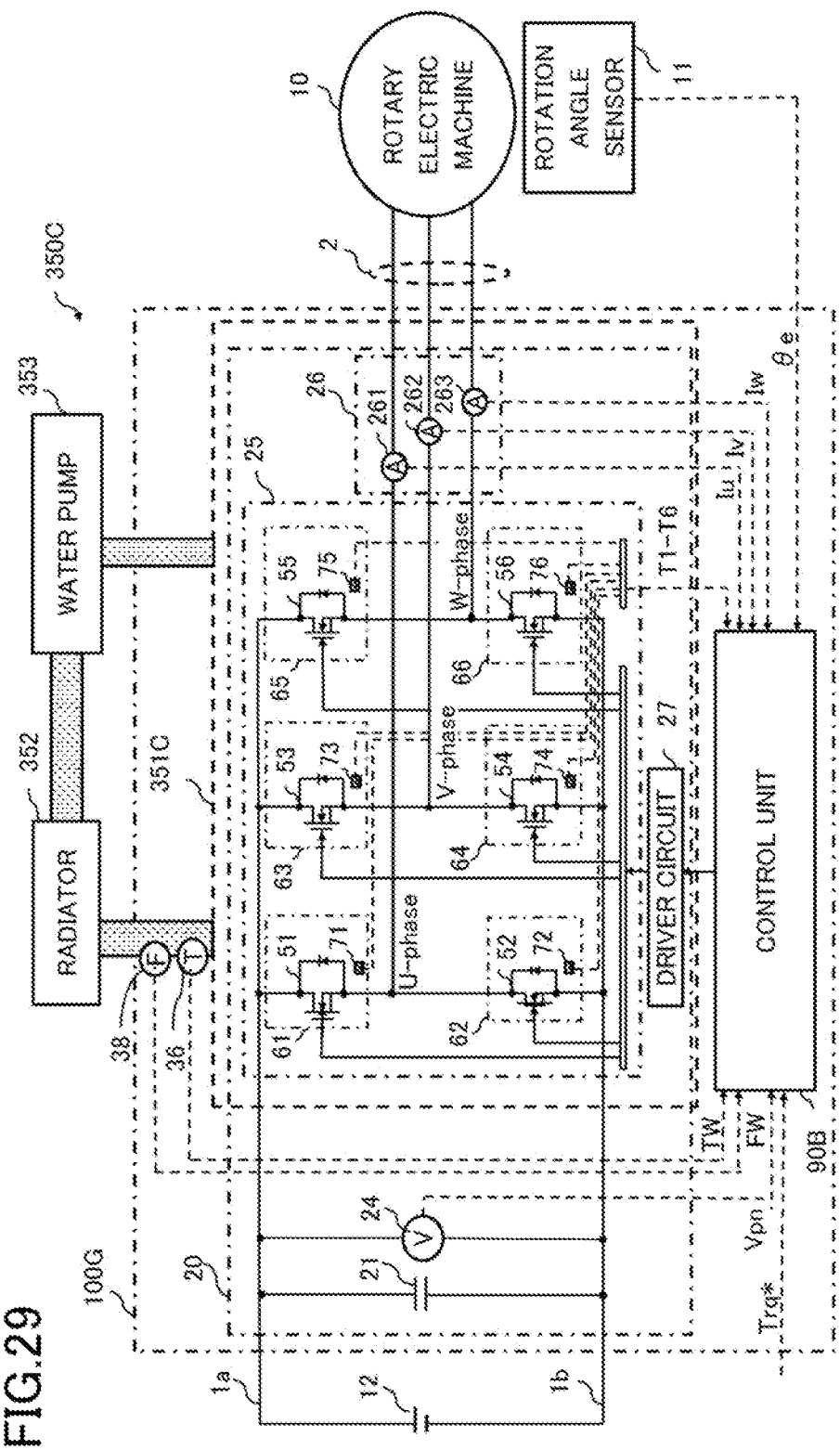
FIG. 29 is a configuration diagram of an electric-power conversion apparatus according to Embodiment 3.
Figure 30:
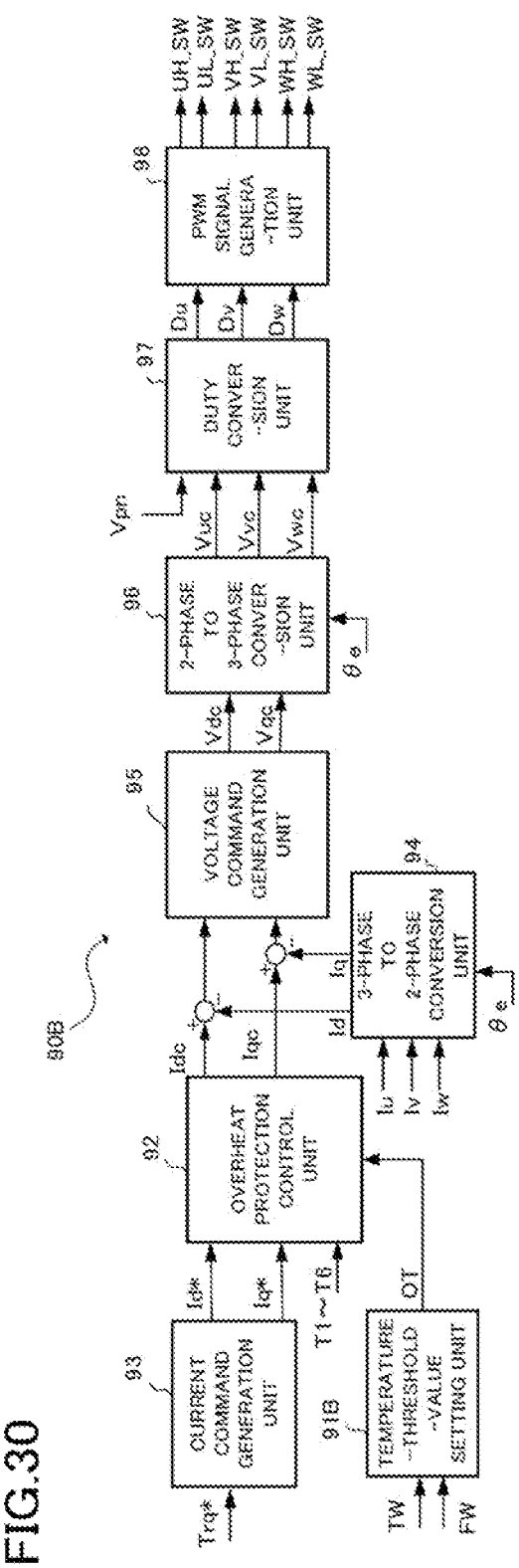
FIG. 30 is a function block diagram of a control unit in the electric-power conversion apparatus according to Embodiment 3.
Figure 31:
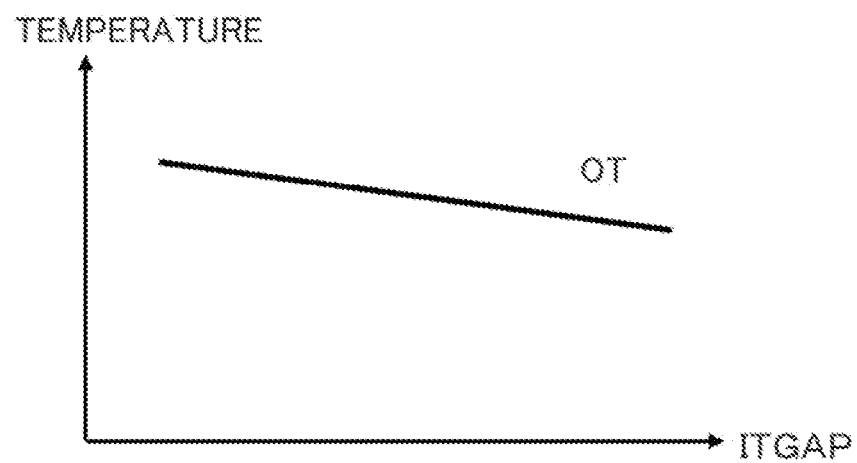
FIG. 31 is a graph illustrating a relationship between a cooling capacity and a variably-set temperature threshold value, with respect to the electric-power conversion apparatus according to Embodiment 3.

FIG. 29 is a configuration diagram of an electric-power conversion apparatus 100G according to Embodiment 3. FIG. 30 is a function block diagram of a control unit 90B in the electric-power conversion apparatus 100G according to Embodiment 3. FIG. 31 is a graph for illustrating a setting method of the temperature threshold value OT by the electric-power conversion apparatus 100G according to Embodiment 3.

The electric-power conversion apparatus 100G according to Embodiment 3 includes, as a cooling-medium state detection means, both the water temperature sensor 36 and the flow rate sensor 38, in a cooler 351C. The control unit 90B imports the temperature TW of the cooling medium detected by the water temperature sensor 36 and the flow rate FW of the cooling medium detected by the flow rate sensor 38. Then, a temperature-threshold-value setting unit 91B in the control unit 90B sets the temperature threshold value OT on the basis of the temperature TW and the flow rate FW of the cooling medium.

The temperature-threshold-value setting unit 91B is characterized by setting the temperature threshold value OT so that it becomes higher as the temperature TW of the cooling medium increases and it becomes higher as the flow rate FW of the cooling medium increases. The temperature-threshold-value setting unit 91B acquires the temperature TW and the flow rate FW of the cooling medium. Then, it calculates, using a method to be described later, a temperature gap index ITGAP with respect to the junction portion temperature TJ about the semiconductor switching devices 51 to 56 and the detection temperature TD of the device temperature detectors 71 to 76 under the operation conditions concerned. Then, it sets the temperature threshold value OT on the basis of the temperature gap index ITGAP. The temperature threshold value OT is set so that it becomes higher as the temperature TW of the cooling medium increases and it becomes higher as the flow rate FW of the cooling medium increases.

The temperature-threshold-value setting unit 91B calculates an allowable temperature-rise amount AT for the cooling medium, from the difference between the operating limit temperature OTJ about the semiconductor switching devices 51 to 56 and the temperature TW of the cooling medium. Namely, the amount ΔT is calculated as ΔT=OTJ−TW.

As has been described in Embodiment 1, the temperature-gap amount TGAP between the junction portion temperature TJ about the semiconductor switching devices 51 to 56 and the detection temperature TD of the device temperature detectors 71 to 76 at the time the semiconductor switching devices 51 to 56 reach an overheating state, becomes smaller as the temperature TW of the cooing medium increases, namely, as the allowable temperature-rise amount ΔT decreases. The amount TGAP can be calculated as TGAP=TJ−TD.

Meanwhile, as has been described in Embodiment 2, the temperature-gap amount TGAP between the junction portion temperature TJ about the semiconductor switching devices 51 to 56 and the detection temperature TD of the device temperature detectors 71 to 76 at the time the semiconductor switching devices 51 to 56 reach an overheating state, becomes smaller as the flow rate FW of the cooling medium increases.

The temperature threshold value OT can be set so that it becomes higher as the temperature-gap amount TGAP decreases. Namely, the temperature threshold value OT can be set so that it becomes higher as the allowable temperature-rise amount ΔT for the cooling medium decreases and as the flow rate FW of the cooling medium increases.

In Embodiment 3, the temperature gap index ITGAP is calculated by dividing the allowable temperature-rise amount ΔT by the flow rate FW of the cooling medium. Namely, the index ITGAP is calculated as ITGAP=ΔT/FW. As shown in FIG. 31, the temperature threshold value OT is set so that it becomes higher as the temperature gap index ITGAP decreases.

This makes it possible to set the temperature threshold value OT on the basis of both the temperature TW and the flow rate FW of the cooling medium. The temperature threshold value OT is set so that it becomes higher as the temperature TW of the cooling medium increases and also it becomes higher as the flow rate FW of the cooling medium increases.

It is noted that, for the electric-power conversion apparatus 100G according to Embodiment 3, a configuration is employed in which the temperature gap index ITGAP is calculated by dividing the allowable temperature-rise amount ΔT by the flow rate FW of the cooling medium, and the temperature threshold value OT is set so that it becomes higher as the temperature gap index ITGAP decreases. However, such a configuration may instead be employed in which information of temperature threshold values OT each corresponding to a specific combination of a temperature TW of the cooling medium and a flow rate FW of the cooling medium, is already included as a three-dimensional map. In the three-dimensional map, the temperature threshold values OT are set to have a relationship in which the temperature threshold value becomes higher as the temperature TW of the cooling medium increases and also as the flow rate FW of the cooling medium increases.

Because of the acquisition of the temperature TW and the flow rate FW of the cooling medium, the electric-power conversion apparatus 100G according to Embodiment 3 can execute overheat protection of the semiconductor switching devices 51 to 56, more properly. This makes it possible to provide an efficient electric-power conversion apparatus 100G which suppresses unduly restricting the output of the electric-power conversion apparatus 100G while preventing overheating of the semiconductor switching devices 51 to 56 more appropriately.

For each of the electric-power conversion apparatuses according to the foregoing respective embodiments, a configuration is employed in which, as the current restriction method, the current command values of the d-axis current command value Id* and the q-axis current command value Iq* are restricted. However, the current restriction method is not limited to that method, and may be any other method so far as it restricts the current commands equivalently.

For example, a method of restricting a command inputted from an upper-level system (not illustrated) may be employed. More specifically, the torque command value Trq* may be restricted to a specified torque command value, to thereby reduce the current command values equivalently. Further, the torque command value Trq* may be restricted to a command value obtained by multiplying that torque command value by a ratio smaller than 1, to thereby reduce the current command values equivalently.

Further, the description has been made assuming that the electric-power conversion apparatuses according to the foregoing embodiments are each an inverter for converting DC power to AC power; however, the type of the electric-power conversion apparatus is not limited thereto. It may be any electric-power conversion apparatus so far as it includes semiconductor switching devices and converts a power output mode. For example, the electric-power conversion apparatus may be an AC-DC converter for converting AC power to DC power or a DC-DC converter for outputting DC-power current and voltage after changing their levels.

In the present disclosure, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present disclosure. For example, such cases shall be included where at least one configuration element is modified; where at least one configuration element is added or omitted; and furthermore, where at least one configuration element is extracted and combined with a configuration element of another embodiment.

Various embodiments disclosed above are summarized in the following appendices.

APPENDIX 1

An electric-power conversion apparatus, comprising:
switching devices that each permit a current to flow therethrough or shut off that current;
at least one device temperature detector that detects a temperature of one or more of the switching devices;
a cooler that cools down the switching devices;
a cooling-medium state detector that detects a state of a cooling medium passing through the cooler; and
a control unit that controls the switching devices to thereby perform electric-power conversion, and that performs overheat prevention control of the switching devices;
wherein the control unit determines a temperature threshold value to be used for judging whether the overheat prevention control is necessary or not, on a basis of the state of the cooling medium detected by the cooling-medium state detector; and when the temperature detected by said at least one device temperature detector is higher than the temperature threshold value, the control unit performs the overheat prevention control by restricting operations of the switching devices.

APPENDIX 2

The electric-power conversion apparatus as set forth in Appendix 1, wherein the cooling-medium state detector is a cooling-medium temperature detector that detects a temperature of the cooling medium.

APPENDIX 3

The electric-power conversion apparatus as set forth in Appendix 1, wherein the cooling-medium state detector is a cooler temperature detector that detects a temperature of the cooler.

APPENDIX 4

The electric-power conversion apparatus of as set forth in Appendix 2 or 3, wherein the control unit sets the temperature threshold value so that it becomes higher as the temperature detected by the cooling-medium state detector increases.

APPENDIX 5

The electric-power conversion apparatus as set forth in any one of Appendices 1 to 4, wherein, in a case where the temperature detected by said at least one device temperature detector is higher than the temperature threshold value, the control unit makes a restriction ratio for restricting the operations of the switching devices higher as a difference between the temperature detected by said at least one device temperature detector and the temperature threshold value increases.

APPENDIX 6

The electric-power conversion apparatus as set forth in Appendix 1, wherein the cooling-medium state detector is a cooling-medium flow rate detector that detects a flow rate of the cooling medium.

APPENDIX 7

The electric-power conversion apparatus as set forth in Appendix 6, wherein the control unit sets the temperature threshold value so that it becomes higher as the flow rate of the cooling medium detected by the cooling-medium flow rate detector increases.

APPENDIX 8

The electric-power conversion apparatus as set forth in Appendix 1, which comprises, as the cooling-medium state detector, a cooling-medium temperature detector that detects a temperature of the cooling medium and a cooling-medium flow rate detector that detects a flow rate of the cooling medium,
wherein the control unit determines the temperature threshold value on a basis of the temperature of the cooling medium detected by the cooling-medium temperature detector and the flow rate of the cooling medium detected by the cooling-medium flow rate detector.

APPENDIX 9

The electric-power conversion apparatus as set forth in Appendix 8, wherein the control unit sets the temperature threshold value so that it becomes higher as the flow rate of the cooling medium detected by the cooling-medium flow rate detector increases and also it becomes higher as the temperature detected by the cooling-medium state detector increases.

APPENDIX 10

The electric-power conversion apparatus as set forth in any one of Appendices 1 to 9, wherein the switching devices are provided as parallelly-arranged multiple sets of switching devices, and a number of said at least one device temperature detector is smaller than a number of the switching devices.

APPENDIX 11

The electric-power conversion apparatus as set forth in Appendices 10, which comprises:
multiple-phase arms each provided with a positive-side switching device connected to a positive side of a DC power source and a negative-side switching device connected to a negative side of the DC power source, as the set of switching devices, and an external connection point at which the positive-side switching device and the negative-side switching device are connected in series to each other and from which a current is supplied to an outside;
a positive-side device temperature detector as said at least one device temperature detector that detects a temperature of the positive-side switching device; and
a negative-side device temperature detector as said at least one device temperature detector that detects a temperature of the negative-side switching device;
wherein the control unit restricts operations of the switching devices when the temperature detected by the positive-side device temperature detector or the negative-side device temperature detector is higher than the temperature threshold value.

APPENDIX 12

The electric-power conversion apparatus of any one of Appendices 1 to 11, wherein said at least one device temperature detector is a thermistor.

APPENDIX 13

The electric-power conversion apparatus as set forth in any one of Appendices 1 to 12, wherein the switching devices are formed of a wide bandgap semiconductor.

What is claimed is:
1. An electric-power conversion apparatus, comprising:
switching devices that each permit a current to flow therethrough or shut off that current;
at least one device temperature detector that detects a temperature of one or more of the switching devices;
a cooler that cools down the switching devices;
a cooling-medium state detector that detects a state of a cooling medium passing through the cooler; and
a controller that controls the switching devices to thereby perform electric-power conversion, and that performs overheat prevention control of the switching devices;
wherein the controller determines a temperature threshold value to be used for judging whether the overheat prevention control is necessary or not, on a basis of the state of the cooling medium detected by the cooling-medium state detector; and when the temperature detected by said at least one device temperature detector is higher than the temperature threshold value, the controller performs the overheat prevention control by restricting operations of the switching devices.

2. The electric-power conversion apparatus of claim 1, wherein the cooling-medium state detector is a cooling-medium temperature detector that detects a temperature of the cooling medium.

3. The electric-power conversion apparatus of claim 1, wherein the cooling-medium state detector is a cooler temperature detector that detects a temperature of the cooler.

4. The electric-power conversion apparatus of claim 2, wherein the controller sets the temperature threshold value so that it becomes higher as the temperature detected by the cooling-medium state detector increases.

5. The electric-power conversion apparatus of claim 1, wherein, in a case where the temperature detected by said at least one device temperature detector is higher than the temperature threshold value, the controller makes a restriction ratio for restricting the operations of the switching devices higher as a difference between the temperature detected by said at least one device temperature detector and the temperature threshold value increases.

6. The electric-power conversion apparatus of claim 1, wherein the cooling-medium state detector is a cooling-medium flow rate detector that detects a flow rate of the cooling medium.

7. The electric-power conversion apparatus of claim 6, wherein the controller sets the temperature threshold value so that it becomes higher as the flow rate of the cooling medium detected by the cooling-medium flow rate detector increases.

8. The electric-power conversion apparatus of claim 1, which comprises, as the cooling-medium state detector, a cooling-medium temperature detector that detects a temperature of the cooling medium and a cooling-medium flow rate detector that detects a flow rate of the cooling medium,
wherein the controller determines the temperature threshold value on a basis of the temperature of the cooling medium detected by the cooling-medium temperature detector and the flow rate of the cooling medium detected by the cooling-medium flow rate detector.

9. The electric-power conversion apparatus of claim 8, wherein the controller sets the temperature threshold value so that it becomes higher as the flow rate of the cooling medium detected by the cooling-medium flow rate detector increases and also it becomes higher as the temperature detected by the cooling-medium temperature detector increases.

10. The electric-power conversion apparatus of claim 1, wherein the switching devices are provided as parallelly-arranged multiple sets of switching devices, and a number of said at least one device temperature detector is smaller than a number of the switching devices.

11. The electric-power conversion apparatus of claim 10, which comprises:

multiple-phase arms each provided with a positive-side switching device connected to a positive side of a DC power source and a negative-side switching device connected to a negative side of the DC power source, as the set of switching devices, and an external connection point at which the positive-side switching device and the negative-side switching device are connected in series to each other and from which a current is supplied to an outside;

a positive-side device temperature detector as said at least one device temperature detector that detects a temperature of the positive-side switching device; and a negative-side device temperature detector as said at least one device temperature detector that detects a temperature of the negative-side switching device;

wherein the controller restricts operations of the switching devices when the temperature detected by the positive-side device temperature detector or the negative-side device temperature detector is higher than the temperature threshold value.

12. The electric-power conversion apparatus of claim 1, wherein said at least one device temperature detector is a thermistor.

13. The electric-power conversion apparatus of claim 1, wherein the switching devices are formed of a wide bandgap semiconductor.

* * * * *